US012604501B2

(12) United States Patent
 Kim et al.

(10) Patent No.: US 12,604,501 B2
(45) Date of Patent: Apr. 14, 2026

(54) SEMICONDUCTOR DEVICE

(71) Applicant: Samsung Electronics Co., Ltd.,
 Suwon-si (KR)

(72) Inventors: Dong Woo Kim, Incheon (KR); Gyeom Kim, Hwsaseong-si (KR); Jin Bum Kim, Seoul (KR); Dong Suk Shin, Suwon-si (KR); Sang Moon Lee, Suwon-si (KR)

(73) Assignee: Samsung Electronics Co., Ltd.,
 Suwon-si (KR)

( * ) Notice: Subject to any disclaimer, the term of this patent is extended or adjusted under 35 U.S.C. 154(b) by 790 days.

(21) Appl. No.: 17/672,233

(22) Filed: Feb. 15, 2022

(65) Prior Publication Data

US 2023/0011153 A1 Jan. 12, 2023

(30) Foreign Application Priority Data

Jul. 6, 2021 (KR) ........................ 10-2021-0088355

(51) Int. Cl.
 *H10D 62/10* (2025.01)
 *H10D 30/67* (2025.01)
(52) U.S. Cl.
 CPC ....... *H10D 62/118* (2025.01); *H10D 30/6713* (2025.01); *H10D 30/6729* (2025.01); *H10D 30/6735* (2025.01); *H10D 30/6757* (2025.01)
(58) Field of Classification Search
 CPC .......... H01L 29/0665; H01L 29/41733; H01L 29/42392; H01L 29/78618;
 (Continued)

(56) References Cited

U.S. PATENT DOCUMENTS 7,365,010 B2    4/2008 Rhee et al.
8,470,660 B2    6/2013 In et al.
             (Continued)

FOREIGN PATENT DOCUMENTS

KR    10-2016-0097869 A    8/2016
KR    10-2018-0060906 A    6/2018
             (Continued)

*Primary Examiner* — Eliseo Ramos Feliciano
*Assistant Examiner* — Thaddeus J Kolb
(74) *Attorney, Agent, or Firm* — Wolf, Greenfield & Sacks, P.C.

(57) ABSTRACT

A semiconductor device comprises an active pattern on a substrate; a plurality of nanosheets spaced apart from each other; a gate electrode surrounding each of the nanosheets; a field insulating layer surrounding side walls of the active pattern; an interlayer insulating layer on the field insulating layer; a source/drain region comprising a first doping layer on the active pattern, a second doping layer on the first doping layer, and a capping layer forming side walls adjacent to the interlayer insulating layer; a source/drain contact electrically connected to, and on, the source/drain region, and a silicide layer between the source/drain region and the source/drain contact which contacts contact with the second doping layer and extends to an upper surface of the source/drain region. The capping layer extends from an upper surface of the field insulating layer to the upper surface of the source/drain region along side walls of the silicide layer.

20 Claims, 35 Drawing Sheets

(58) Field of Classification Search
CPC .......... H01L 29/78696; H01L 29/0847; H01L 21/28518; H01L 29/0673; H01L 29/41766; H01L 29/66439; H01L 29/665; H01L 29/165; H01L 29/7848; H01L 29/66545; H01L 29/775; H01L 21/823418; H01L 21/823412; H01L 21/823437; H01L 21/823462; H01L 21/823475; H01L 21/823481; B82Y 10/00
See application file for complete search history.

(56) References Cited

U.S. PATENT DOCUMENTS

| | | | |
|---|---|---|---|
| 8,765,545 B2 | 7/2014 | Lin et al. | |
| 8,994,097 B2 | 3/2015 | Lin et al. | |
| 9,214,556 B2 | 12/2015 | Wann et al. | |
| 9,466,670 B2 | 10/2016 | Hsiao et al. | |
| 9,653,563 B2 | 5/2017 | Liaw | |
| 9,755,047 B2 | 9/2017 | Chen et al. | |
| 9,972,537 B2 | 5/2018 | Jacob | |
| 10,008,501 B2 | 6/2018 | Hsiao et al. | |
| 10,090,392 B2 | 10/2018 | Chen et al. | |
| 10,157,934 B2 | 12/2018 | Liaw | |
| 11,855,177 B2 * | 12/2023 | Chu | H01L 21/02532 |
| 2018/0175172 A1 * | 6/2018 | Chang | H10D 62/82 |
| 2021/0104524 A1 * | 4/2021 | Hwang | H10D 84/017 |
| 2022/0367728 A1 * | 11/2022 | Lin | H10D 84/038 |

FOREIGN PATENT DOCUMENTS

| | | | |
|---|---|---|---|
| KR | 10-2018-0069701 A | 6/2018 | |
| KR | 10-2019-0143209 A | 12/2019 | |
| KR | 10-2021-0017167 A | 2/2021 | |
| KR | 10-2021-0040233 A | 4/2021 | |

* cited by examiner

SEMICONDUCTOR DEVICE

This application claims priority from Korean Patent Application No. 10-2021-0088355 filed on Jul. 6, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor device. Specifically, the present disclosure relates to a semiconductor device including an MBCFET™ (Multi-Bridge Channel Field Effect Transistor).

2. Description of the Related Art

There are several scaling technologies for increasing density of a semiconductor device. In one, a multi gate transistor is proposed, in which a fin-shaped or nanowire-shaped silicon body is formed on a substrate and a gate is formed on a surface of the silicon body.

Since such a multi gate transistor utilizes three-dimensional channels, scaling is easily performed. Further, even if a gate length of the multi gate transistor is not increased, current control capability may be improved. Furthermore, a SCE (short channel effect) in which potential of a channel region is influenced by a drain voltage may be effectively suppressed.

SUMMARY

Aspects of the present disclosure provide a semiconductor device in which reliability may be improved by forming a silicide layer by the use of a source/drain region formed by multiple films to reduce the resistance of a source/drain contact.

According to an example embodiment of the present disclosure, there is provided a semiconductor device comprising: a substrate; an active pattern which extends in a first horizontal direction on the substrate; a plurality of nanosheets spaced apart from each other in a vertical direction and extending in the first horizontal direction on the active pattern; a gate electrode which extends in a second horizontal direction different from the first horizontal direction on the substrate and surrounds each of the plurality of nanosheets; a field insulating layer on the substrate which surrounds side walls of the active pattern; an interlayer insulating layer on the field insulating layer; a source/drain region on at least one side of the gate electrode on the active pattern which comprises a first doping layer on the active pattern, a second doping layer on the first doping layer, and a capping layer that comprises side walls adjacent to the interlayer insulating layer; a source/drain contact which is electrically connected to the source/drain region and is on the source/drain region; and a silicide layer between the source/drain region and the source/drain contact wherein the silicide layer is in contact with the second doping layer and extends to an upper surface of the source/drain region on the second doping layer, wherein the capping layer extends from an upper surface of the field insulating layer to the upper surface of the source/drain region along side walls of the silicide layer.

According to another example embodiment of the present disclosure, there is provided a semiconductor device comprising: a substrate; an active pattern which extends in a first horizontal direction on the substrate; a plurality of nanosheets spaced apart from each other in a vertical direction and extending in the first horizontal direction on the active pattern; a gate electrode which extends in a second horizontal direction different from the first horizontal direction on the substrate and surrounds each of the plurality of nanosheets; a field insulating layer on the substrate which surrounds side walls of the active pattern; an interlayer insulating layer on the field insulating layer; a source/drain region on at least one side of the gate electrode on the active pattern which comprises a capping layer that comprises side walls adjacent to the interlayer insulating layer; a source/drain contact which is electrically connected to the source/drain region and is on the source/drain region; and a silicide layer between the source/drain region and the source/drain contact wherein the silicide layer comprises a first layer along an inner surface of the source/drain region and a second layer between the first layer and the source/drain contact which extends along side walls of the capping layer to an upper surface of the source/drain region, wherein the first layer and the second layer comprise different materials from each other, the capping layer comprises silicon that is not doped with an impurity, and an uppermost surface of the silicide layer is coplanar with an uppermost surface of the capping layer.

According to another example embodiment of the present disclosure, there is provided a semiconductor device comprising: a substrate having a first region and a second region; a first active pattern which extends in a first horizontal direction on the first region of the substrate; a plurality of nanosheets spaced apart from each other in a vertical direction and extending in the first horizontal direction on the first active pattern; a first gate electrode which extends in a second horizontal direction different from the first horizontal direction on the first region of the substrate and surrounds each of the plurality of nanosheets; a field insulating layer on the substrate which surrounds side walls of the first active pattern; an interlayer insulating layer on the field insulating layer; a first source/drain region on at least one side of the first gate electrode on the first active pattern which comprises a first doping layer on the first active pattern, a second doping layer on the first doping layer, and a first capping layer that comprises side walls adjacent to the interlayer insulating layer; a first source/drain contact which is electrically connected to the first source/drain region and is on the first source/drain region; and a first silicide layer between the first source/drain region and the first source/drain contact wherein the first silicide layer comprises a first layer along a surface of the second doping layer, a second layer extending to an upper surface of the first source/drain region along side walls of the first capping layer, and a third layer disposed between the first layer and the first source/drain contact and between the second layer and the first source/drain contact, wherein one or more of the first layer, the second layer and the third layer comprise at least one different material from one or more of the other layers, the first capping layer comprises silicon that is not doped with an impurity, and the first capping layer extends from an upper surface of the field insulating layer to the upper surface of the first source/drain region along side walls of the first silicide layer.

However, aspects of the present disclosure are not restricted to the one set forth herein. The above aspects, and other aspects of the present disclosure, will become more apparent to one of ordinary skill in the art to which the present disclosure pertains by referencing the detailed description of the present disclosure given below.

BRIEF DESCRIPTION OF THE DRAWINGS

The above aspects, and other aspects and features of the present disclosure, will become more apparent by describing in detail example embodiments thereof referring to the attached drawings, in which:

FIGS. 5 to 17 are intermediate stage diagrams for explaining a method for fabricating a semiconductor device according to some embodiments of the present disclosure;

DETAILED DESCRIPTION OF THE EMBODIMENTS

Although the drawings of a semiconductor device according to some embodiments show inclusion of a MBCFET™ (Multi-Bridge Channel Field Effect Transistor) including a nanosheet as an example, the embodiments are not limited thereto. In some other embodiments, the semiconductor device may include a fin-type transistor (FinFET) including a channel region of a fin-type pattern shape.

Hereinafter, the semiconductor device according to some embodiments of the present disclosure will be described referring to FIGS. 1 to 4.

Figure 1:
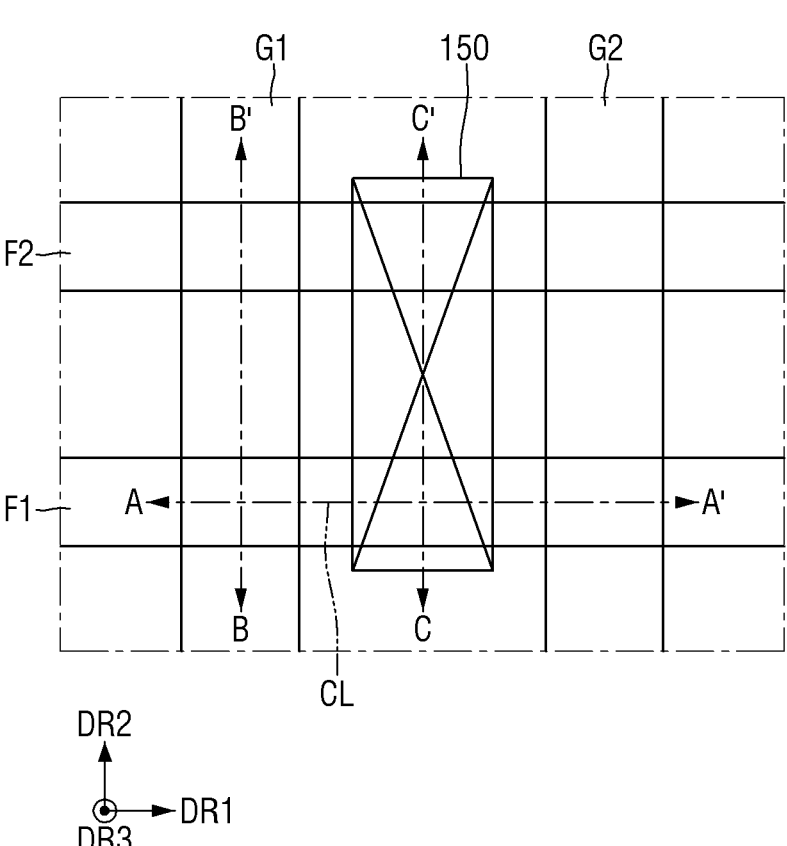
FIG. 1 is a schematic layout diagram of a semiconductor device according to some embodiments of the present disclosure.
Figure 2:
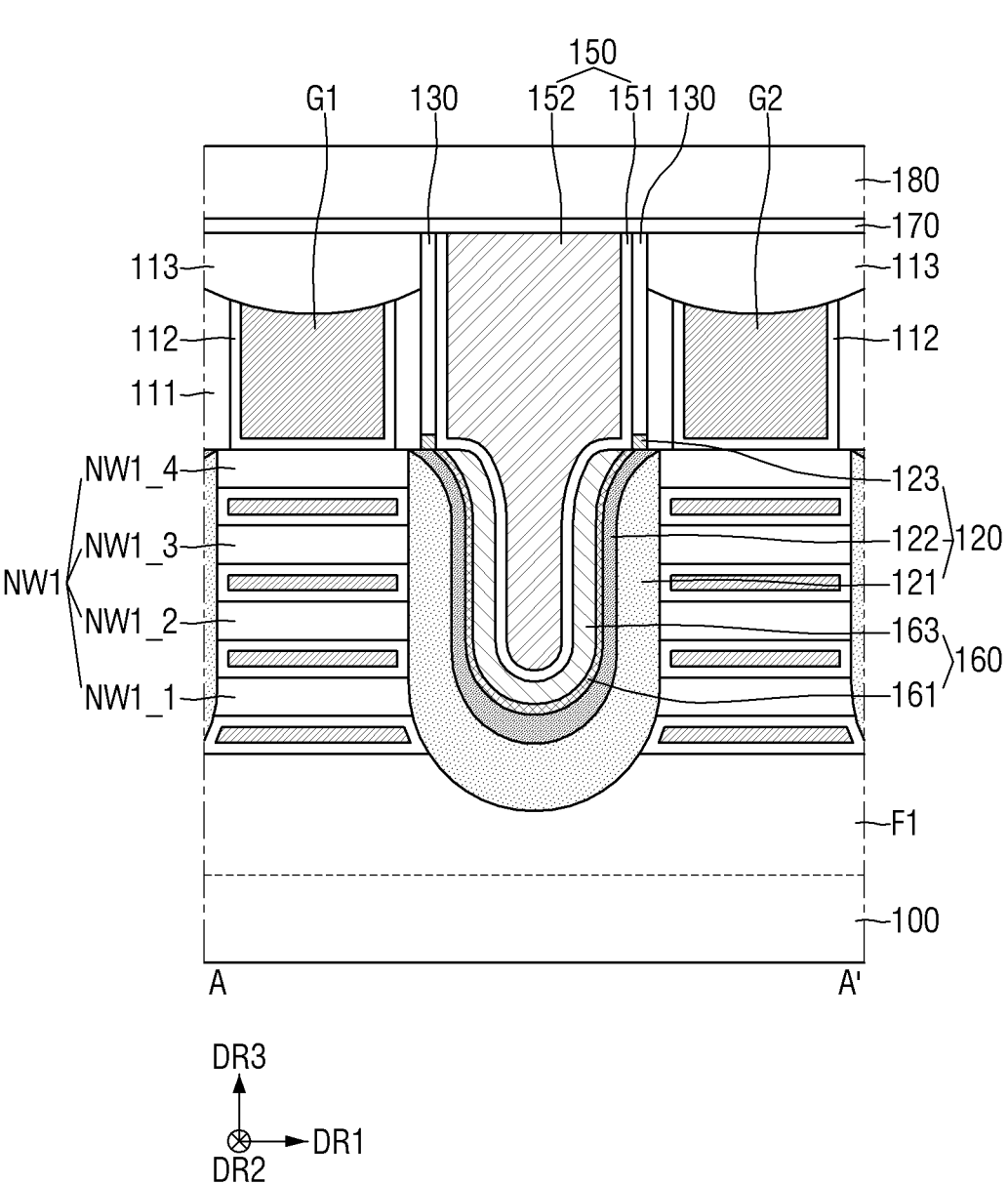
FIG. 2 is a cross-sectional view taken along a line A-A' of FIG. 1.
Figure 3:
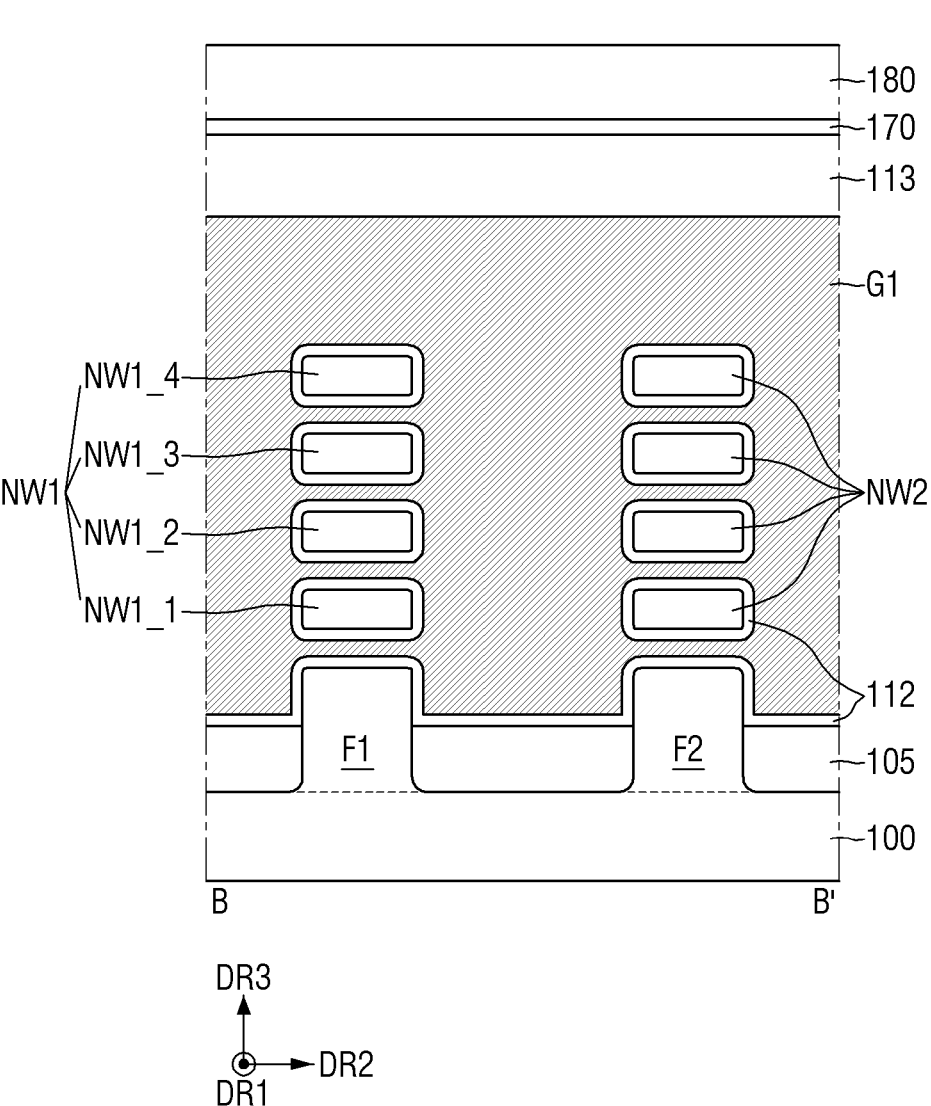
FIG. 3 is a cross-sectional view taken along a line B-B' of FIG. 1.
Figure 4:
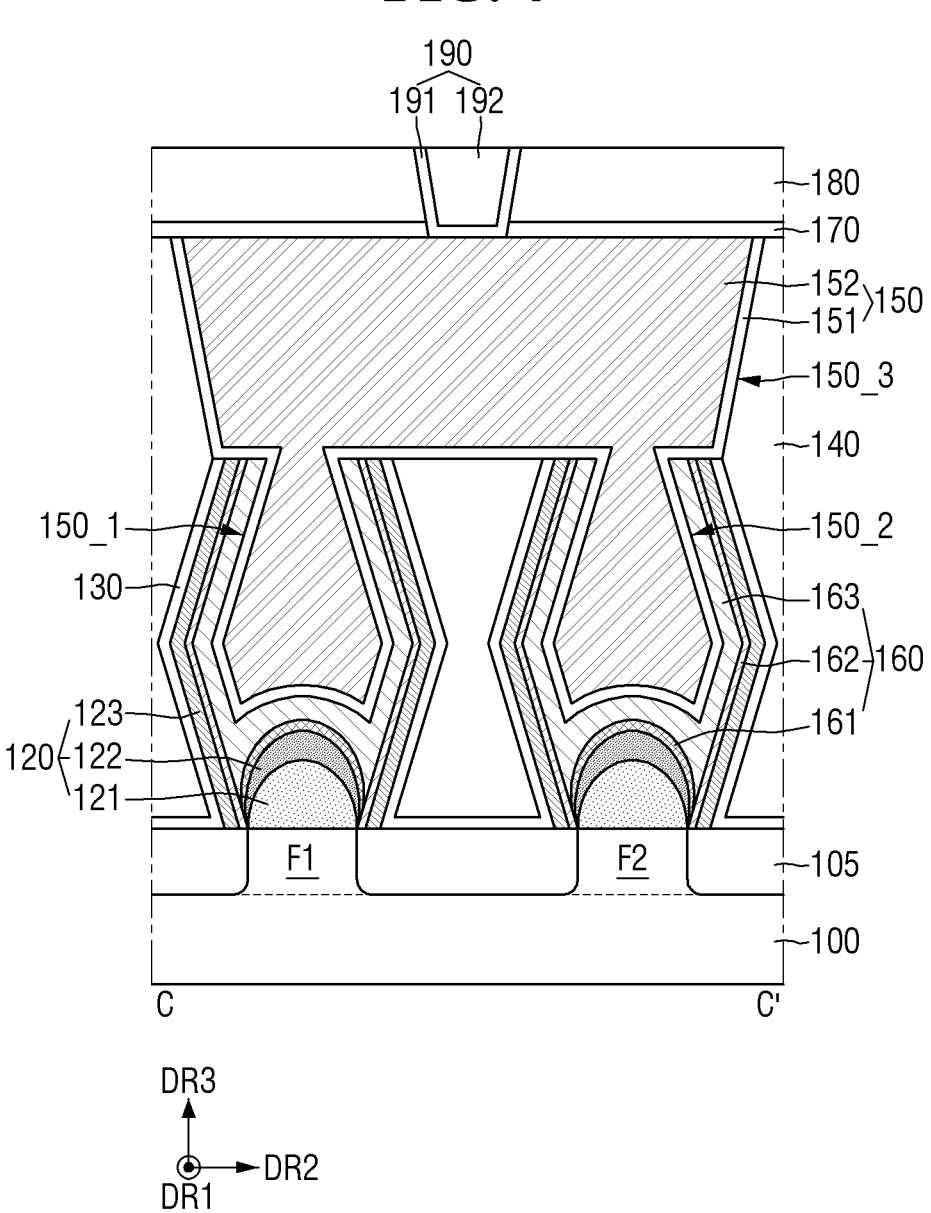
FIG. 4 is a cross-sectional view taken along a line C-C' of FIG. 1.

FIG. 1 is a schematic layout diagram of a semiconductor device according to some embodiments of the present disclosure. FIG. 2 is a cross-sectional view taken along a line A-A' of FIG. 1. FIG. 3 is a cross-sectional view taken along a line B-B' of FIG. 1. FIG. 4 is a cross-sectional view taken along a line C-C' of FIG. 1.

Referring to FIGS. 1 to 4, a semiconductor device according to some embodiments of the present disclosure may include a substrate 100, a first active pattern F1, a second active pattern F2, a field insulating layer 105, a first plurality of nanosheets NW1, a second plurality of nanosheets NW2, a first gate electrode G1, a second gate electrode G2, a gate spacer 111, a gate insulating layer 112, a gate capping pattern 113, a first source/drain region 120, a liner layer 130, a first interlayer insulating layer 140, a first source/drain contact 150, a first silicide layer 160, an etching stop layer 170, a second interlayer insulating layer 180, and a via 190.

The substrate 100 may be a silicon substrate or an SOI (silicon-on-insulator). The substrate 100 may include silicon germanium, SGOI (silicon germanium on insulator), indium antimonide, lead tellurium compounds, indium arsenic, indium phosphide, gallium arsenide or gallium antimonide, but the composition of the substrate 100 is not limited thereto.

Referring to FIG. 1, a first active pattern F1 may extend in a first horizontal direction DR1 (e.g., an X-axis direction) on the substrate 100. The first active pattern F1 may protrude from the substrate 100. The second active pattern F2 may extend in the first horizontal direction DR1 on the substrate 100. The second active pattern F2 may be spaced apart from the first active pattern F1 in a second horizontal direction DR2 (e.g., a Y-axis direction) different from the first horizontal direction DR1. The second active pattern F2 may protrude from the substrate 100. In some embodiments, each of the first active pattern F1 and the second active pattern F2 may be, for example, a fin-type pattern. Each of the first active pattern F1 and the second active pattern F2 may be used as a channel pattern of a transistor.

Each of the first active pattern F1 and the second active pattern F2 may be a part of the substrate 100, and may include an epitaxial layer that is grown from the substrate 100. Each of the first active pattern F1 and the second active pattern F2 may include, for example, silicon or germanium, which are elemental semiconductor materials. Further, each of the first active pattern F1 and the second active pattern F2 may include a compound semiconductor, and may include, for example, a group IV-IV compound semiconductor or a group III-V compound semiconductor.

The group IV-IV compound semiconductor may include, for example, a binary compound or a ternary compound including at least two or more of carbon (C), silicon (Si), germanium (Ge), and tin (Sn), or a compound obtained by doping these elements with a group IV element. The group III-V compound semiconductor may be, for example, at least one of a binary compound, a ternary compound or a quaternary compound formed by combining at least one of aluminum (Al), gallium (Ga) and indium (In) as a group III element with one of phosphorus (P), arsenic (As) and antimony (Sb) as a group V element.

Referring to FIGS. 3 and 4, a field insulating layer 105 may be disposed on the substrate 100. The field insulating layer 105 may be disposed on a part of the side wall of the first active pattern F1 and a part of the side wall of the second active pattern F2. The field insulating layer 105 may include, for example, an oxide film, a nitride film, an oxynitride film or a combination film thereof.

Referring now to FIGS. 2 and 3, a first plurality of nanosheets NW1 may be disposed on the first active pattern F1. The first plurality of nanosheets NW1 may include first to fourth nanosheets NW_1, NW_2, NW_3 and NW_4 that are spaced apart from each other in a vertical direction DR3 (e.g., a Z-axis direction) and stacked. Each of the first to fourth nanosheets NW_1, NW_2, NW_3 and NW_4 may extend in the first horizontal direction DR1 (e.g., an X-axis direction). The first plurality of nanosheets NW1 intersecting the first gate electrode G1 may be spaced apart from the first plurality of nanosheets NW1 intersecting the second gate electrode G2 in the first horizontal direction DR1. In a non-limiting embodiment, the term "nanosheet" used in the specification may refer to a conductive structure (e.g., semiconductor) having a cross-section substantially perpendicular to a current flowing direction. It will be understood that the nanosheet may include a nanowire.

Referring now to FIG. 3, a second plurality of nanosheets NW2 may be disposed on the second active pattern F2. The second plurality of nanosheets NW2 may include four nanosheets spaced apart from each other in the vertical direction DR3 (e.g., a Z-axis direction) and stacked. The second plurality of nanosheets NW2 may be spaced apart from the first plurality of nanosheets NW1 in the second horizontal direction DR2 (e.g., a Y-axis direction). The second plurality of nanosheets NW2 intersecting the first gate electrode G1 may be spaced apart from the second plurality of nanosheets NW2 intersecting the second gate electrode G2 in the first horizontal direction DR1.

Although FIGS. 2 and 3 show that the first plurality of nanosheets NW1 and the second plurality of nanosheets NW2 each include four nanosheets stacked in the vertical direction DR3, this is only one example, and the number of stacked nanosheets is not limited.

Referring to FIGS. 2 and 3, a first gate electrode G1 may extend in the second horizontal direction DR2 on the substrate 100 (e.g., a Y-axis direction). The first gate electrode G1 may intersect each of the first and second active patterns F1 and F2. The first gate electrode G1 may surround each of the first plurality of nanosheets NW1 and the second plurality of nanosheets NW2, as seen for example in FIG. 2. It will be understood that "an element A surrounds an element B" (or similar language) as used herein means that the element A is at least partially around the element B but does not necessarily mean that the element A completely encloses the element B.

The second gate electrode G2 may extend in the second horizontal direction DR2 on the substrate 100. The second gate electrode G2 may intersect each of the first and second active patterns F1 and F2. As seen in FIG. 2, the second gate electrode G2 may be spaced apart from the first gate electrode G1 in the first horizontal direction DR1. The second gate electrode G2 may surround each of the first plurality of nanosheets NW1 and the second plurality of nanosheets NW2.

Each of the first gate electrode G1 and the second gate electrode G2 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and combinations thereof. Each of the first gate electrode G1 and the second gate electrode G2 may include a conductive metal oxide, a conductive metal oxynitride, and the like, and may also include an oxidized form of the above-mentioned materials.

Referring to FIGS. 2 and 3, a gate insulating layer 112 may be disposed between the first plurality of nanosheets NW1 and the first gate electrode G1. The gate insulating layer 112 may also be between the second plurality of nanosheets NW2 and the second gate electrode G2. The gate insulating layer 112 may further be between each of the first and second active patterns F1 and F2 and the first gate electrode G1. The gate insulating layer 112 may also be between each of the first and second active patterns F1 and F2 and the second gate electrode G2. The gate insulating layer 112 may further be between the field insulating layer 105 and the first gate electrode G1, and between the field insulating layer 105 and the second gate electrode G2. The gate insulating layer 112 may also be between the gate spacer 111 and the first gate electrode G1, and between the gate spacer 111 and the second gate electrode G2.

The gate insulating layer 112 may also be between each of the first and second gate electrodes G1 and G2 and the first source/drain region 120. For example, between the first plurality of nanosheets NW1, the gate insulating layer 112 may be in contact with the first source/drain region 120. However, the present disclosure is not limited thereto. In some other embodiments, an internal spacer may be disposed between the gate insulating layer 112 and the first source/drain region 120, between the first plurality of nanosheets NW1.

The gate insulating layer 112 may include at least one of silicon oxide, silicon oxynitride, silicon nitride or a high dielectric constant material having a higher dielectric constant than silicon oxide. The high dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate The semiconductor device according to some other embodiments may include an NC (Negative Capacitance) FET using a negative capacitor. For example, the gate insulating layer 112 may include a ferroelectric material film having ferroelectric properties, and a paraelectric material film having paraelectric properties.

The ferroelectric material film may have a negative capacitance, and the paraelectric material film may have a positive capacitance. For example, when two or more capacitors are connected in series, and the capacitance of each capacitor has a positive value, the overall capacitance decreases from the capacitance of each individual capacitor. On the other hand, when at least one of the capacitances of two or more capacitors connected in series has a negative value, the overall capacitance may be greater than an absolute value of each individual capacitance, while having a positive value.

When the ferroelectric material film having the negative capacitance and the paraelectric material film having the positive capacitance are connected in series, the overall capacitance values of the ferroelectric material film and the paraelectric material film connected in series may increase. By the use of the increased overall capacitance value, a transistor including the ferroelectric material film may have a subthreshold swing (SS) below 60 mV/decade at room temperature.

The ferroelectric material film may have ferroelectric properties. The ferroelectric material film may include, for example, at least one of hafnium oxide, hafnium zirconium oxide, barium strontium titanium oxide, barium titanium oxide, and lead zirconium titanium oxide. Here, as an example, the hafnium zirconium oxide may be a material obtained by doping hafnium oxide with zirconium (Zr). As another example, the hafnium zirconium oxide may be a compound of hafnium (Hf), zirconium (Zr), and oxygen (O).

The ferroelectric material film may further include a doped dopant. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of dopant included in the ferroelectric material film may vary, depending on which type of ferroelectric material is included in the ferroelectric material film.

When the ferroelectric material film includes hafnium oxide, the dopant included in the ferroelectric material film may include, for example, at least one of gadolinium (Gd), silicon (Si), zirconium (Zr), aluminum (Al), and yttrium (Y).

When the dopant is aluminum (Al), the ferroelectric material film may include 3 to 8 at % (atomic %) aluminum. Here, a ratio of the dopant may be a ratio of aluminum to the sum of hafnium and aluminum.

When the dopant is silicon (Si), the ferroelectric material film may include 2 to 10 at % silicon. When the dopant is yttrium (Y), the ferroelectric material film may include 2 to 10 at % yttrium. When the dopant is gadolinium (Gd), the ferroelectric material film may include 1 to 7 at % gadolinium. When the dopant is zirconium (Zr), the ferroelectric material film may include 50 to 80 at % zirconium.

The paraelectric material film may have paraelectric properties. The paraelectric material film may include at least one of, for example, a silicon oxide and a metal oxide having a high dielectric constant. The metal oxide included in the paraelectric material film may include, for example, but is not limited to, at least one of hafnium oxide, zirconium oxide, and aluminum oxide.

The ferroelectric material film and the paraelectric material film may include the same material. The ferroelectric material film has the ferroelectric properties, but the paraelectric material film may not have the ferroelectric properties. For example, when the ferroelectric material film and the paraelectric material film include hafnium oxide, a crystal structure of hafnium oxide included in the ferroelectric material film is different from a crystal structure of hafnium oxide included in the paraelectric material film.

The ferroelectric material film may have a thickness having the ferroelectric properties. A thickness of the ferroelectric material film may be, but is not limited to, for example, 0.5 to 10 nm. Since a critical thickness that exhibits the ferroelectric properties may vary for each ferroelectric material, the thickness of the ferroelectric material film may vary depending on the ferroelectric material.

As an example, the gate insulating layer 112 may include a single ferroelectric material film. In another embodiment, the gate insulating layer 112 may include a plurality of ferroelectric material films spaced apart from each other. The gate insulating layer 112 may have a stacked film structure in which a plurality of ferroelectric material films and a plurality of paraelectric material films are alternately stacked.

Referring back to FIG. 2, a gate spacer 111 may be disposed along the side walls of each of the first and second gate electrodes G1 and G2 on a fourth nanosheet NW1_4, which is an uppermost nanosheet of the first plurality of nanosheets NW1. The gate spacer 111 may also be along side walls of each of the first and second gate electrodes G1 and G2 on the uppermost nanosheet of the second plurality of nanosheets NW2. The gate spacer 111 may also be on the field insulating layer 105 along side walls of each of the first and second gate electrodes G1 and G2.

The gate spacer 111 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof.

Referring to FIGS. 2 and 3, a gate capping pattern 113 may be disposed on each of the first gate electrode G1 and the second gate electrode G2. The gate capping pattern 113 may also be on the upper surfaces of each of the gate spacer 111 and the gate insulating layer 112. However, the present disclosure is not limited thereto. In some other embodiments, the gate capping pattern 113 may also be on each of the gate insulating layer 112, the first gate electrode G1, and the second gate electrode G2 between the inner side walls of the gate spacer 111.

The gate capping pattern 113 may include, for example, a material having an etching selectivity to the first interlayer insulating layer 140 (see FIG. 4). The gate capping pattern 113 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

Referring now to FIGS. 2 and 4, a first source/drain region 120 may be disposed on at least one side of each of the first and second gate electrodes G1 and G2 on the first active pattern F1. Also, the first source/drain region 120 may be disposed on at least one side of each of the first and second gate electrodes G1 and G2 on the second active pattern F2.

As shown in FIG. 4, the first source/drain region 120 disposed on the first active pattern F1 and the first source/drain region 120 disposed on the second active pattern F2 may be spaced apart from each other in the second horizontal direction DR2 (e.g., a Y-axis direction). However, the present disclosure is not limited thereto. In some other embodiments, the first source/drain region 120 disposed on the first active pattern F1 and the first source/drain region 120 disposed on the second active pattern F2 may have a merged shape.

For example, the first source/drain region 120 may include a first doping layer 121, a second doping layer 122, and a first capping layer 123.

The first doping layer 121 may be disposed on the first active pattern F1. The first doping layer 121 may protrude in a convex manner from the upper surface of the first active pattern F1 in the vertical direction DR3 (e.g., a Z-axis direction). The first doping layer 121 may extend along the side walls of the first plurality of nanosheets NW1 to the upper surface of the first source/drain region 120. For example, the bottom surface of the first doping layer 121 may be formed to be lower than the first nanosheet NW1_1. However, the present disclosure is not limited thereto.

The first doping layer 121 may include silicon (Si). The first doping layer 121 may be doped with a first impurity at a first concentration. The first impurity may be, for example, phosphorus (P). However, the present disclosure is not limited thereto.

The second doping layer 122 may be disposed on the first doping layer 121. The second doping layer 122 may protrude in a convex manner from the first doping layer 121 in the vertical direction DR3. The second doping layer 122 may extend along the side wall of the first doping layer 121 to the upper surface of the first source/drain region 120. For example, in a cross section that is cut in the first horizontal direction DR1 along a center line CL (see FIG. 1) that equally divides the first active pattern F1 in the second horizontal direction DR2, the bottom surface of the second doping layer 122 may be formed between the first active pattern F1 and the first nanosheet NW1_1.

The second doping layer 122 may include silicon (Si) or silicon carbide (SiC). When the second doping layer 122 includes silicon (Si), the second doping layer 122 may be doped with first impurity at a second concentration higher than the first concentration. The first impurity may be, for example, phosphorus (P).

When the second doping layer 122 includes silicon carbide (SiC), the second doping layer 122 may be doped with a second impurity. The second impurity may be, for example, any one of phosphorus (P), arsenic (As) and antimony (Sb). However, the present disclosure is not limited thereto.

The first capping layer 123 may form side walls of the first source/drain region 120 adjacent to the first interlayer insulating layer 140. The first capping layer 123 may extend from the upper surface of the field insulating layer 105 to the upper surface of the first source/drain region 120 along the side walls of the first silicide layer 160. In some embodiments, the first capping layer 123 may include silicon (Si) that is not doped with impurities.

Referring to FIGS. 2 and 4, a liner layer 130 may be formed along and conform to the side walls of the gate spacer 111, the side walls of the gate capping pattern 113, and the side walls of the first source/drain region 120. Further, the liner layer 130 may be formed along and conform to the upper surface of the field insulating layer 105. In some embodiments, the liner layer 130 may have a uniform thickness. The liner layer 130 may include, for example, at least one of silicon nitride (SiN), silicon oxynitride (SiON), silicon oxide ($SiO_2$), silicon oxycarbonitride (SiOCN), silicon boronitride (SiBN), silicon oxyboronitride (SiOBN), silicon oxycarbide (SiOC), and combinations thereof.

Referring to FIG. 4, a first interlayer insulating layer 140 may be disposed on the field insulating layer 105. Specifically, the first interlayer insulating layer 140 may be disposed on the liner layer 130. The first interlayer insulating layer 140 may surround the side walls of the first source/drain region 120, the side walls of the gate spacer 111, and the side walls of the gate capping pattern 113. In some embodiments, the upper surface of the first interlayer insulating layer 140 may be formed on a same plane as (i.e., "coplanar with") the upper surface of the gate capping pattern 113. However, the present disclosure is not limited thereto. In some other embodiments, the first interlayer insulating layer 140 may also cover the upper surface of the gate capping pattern 113.

The first interlayer insulating layer 140 may include, for example, at least one of silicon oxide, silicon nitride, silicon oxynitride and a low dielectric constant material. The low dielectric constant material may include, for example, Fluorinated TetraEthylOrthoSilicate (FTEOS), Hydrogen Silses- Quioxane (HSQ), Bis-benzoCycloButene (BCB), TetraMethylOrthoSilicate (TMOS), OctaMethyleyCloTetraSiloxane (OMCTS), HexaMethylDiSiloxane (HMDS), TriMethylSilyl Borate (TMSB), DiAcetoxyDitertiaryButoSiloxane (DADBS), TriMethylSilil Phosphate (TMSP), PolyTetraFluoroEthylene (PTFE), TOSZ (Tonen SilaZen), FSG (Fluoride Silicate Glass), polyimide nanofoams such as polypropylene oxide, CDO (Carbon Doped silicon Oxide), OSG (Organo Silicate Glass), SiLK, Amorphous Fluorinated Carbon, silica aerogels, silica xerogels, mesoporous silica or combinations thereof. However, the present disclosure is not limited thereto.

Referring to FIGS. 2 and 4, a first source/drain contact 150 may penetrate the first interlayer insulating layer 140 in the vertical direction DR3 (e.g., a Z-axis direction) and extend into the first source/drain region 120. That is, at least a part of the first source/drain contact 150 may be surrounded by the first source/drain region 120. The first source/drain contact 150 may be electrically connected to the first source/drain region 120.

Referring to FIG. 4, a first source/drain contact 150 may include a first portion 150_1, a second portion 150_2, and a third portion 150_3. The first portion 150_1 of the first source/drain contact 150 may be surrounded by a first source/drain region 120 disposed on the first active pattern F1. The second portion 150_2 of the first source/drain contact 150 may be surrounded by the first source/drain region 120 disposed on the second active pattern F2.

The third portion 150_3 of the first source/drain contact 150 may be disposed on the first portion 150_1 of the first source/drain contact 150, the second portion 150_2 of the first source/drain contact 150, and the first source/drain region 120. The third portion 150_3 of the first source/drain contact 150 may connect the first portion 150_1 of the first source/drain contact 150 and the second portion 150_2 of the first source/drain contact 150.

The first source/drain contact 150 may include a first contact barrier layer 151 and a first contact filling layer 152. The first contact barrier layer 151 may form side walls and a bottom surface of the first source/drain contact 150. The first contact filling layer 152 may be disposed on the first contact barrier layer 151.

The first contact barrier layer 151 may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh). However, the present disclosure is not limited thereto.

The first contact filling layer 152 may include, for example, at least one of aluminum (Al), copper (Cu), tungsten (W), cobalt (Co), ruthenium (Ru), and molybdenum (Mo). However, the present disclosure is not limited thereto.

The first silicide layer 160 may be disposed between the first source/drain region 120 and the first source/drain contact 150. The first silicide layer 160 may be disposed between the second doping layer 122 and the first contact barrier layer 151. The first silicide layer 160 may be disposed between the first capping layer 123 and the first contact barrier layer 151.

Still referring to FIGS. 2 and 4, a first silicide layer 160 may be in contact with each of the second doping layer 122 and the first capping layer 123. The first silicide layer 160 may extend on the second doping layer 122 along the side wall of the second doping layer 122 to the upper surface of the first source/drain region 120. Further, the first silicide layer 160 may extend along the inner side walls of the first capping layer 123 to the upper surface of the first source/drain region 120. For example, an uppermost surface of the first silicide layer 160 may be formed on a same plane as (i.e., "coplanar with") an uppermost surface of the first capping layer 123.

The first silicide layer 160 may be formed of multiple films. For example, the first silicide layer 160 may include first to third layers 161, 162 and 163. The first to third layers 161, 162 and 163 may include different materials from each other.

The first layer 161 may be disposed along an upper surface of the second doping layer 122. The first layer 161 may include a material in which a part of the second doping layer 122 is silicidized. For example, if the second doping layer 122 includes silicon (Si) with a first impurity doped at a second concentration, the first layer 161 may include a material in which silicon (Si) with the first impurity doped at the second concentration is silicidized. In another embodiment, when the second doping layer 122 includes silicon carbide (SiC) doped with the second impurity, the first layer 161 may include a material in which silicon carbide (SiC) doped with the second impurity is silicidized.

The second layer 162 may be disposed along the side walls of the first capping layer 123. For example, the second layer 162 may extend along the side walls of the first capping layer 123 to the upper surface of the first source/drain region 120. The second layer 162 may include a material in which a part of the first capping layer 123 is silicidized. For example, the second layer 162 may include a material in which silicon (Si) not doped with impurities is silicidized.

The third layer 163 may be disposed between the first layer 161 and the first source/drain contact 150, and between the second layer 162 and the first source/drain contact 150. The third layer 163 may extend along the side walls of the second layer 162 to the upper surface of the first source/drain region 120. For example, the third layer 163 may include a material in which silicon (Si) doped with the first impurity at a third concentration higher than the second concentration is silicidized.

Referring now to FIGS. 2-4, a etching stop layer 170 may be disposed on the first interlayer insulating layer 140 and the first source/drain contact 150. The etching stop layer 170 may cover a part of the upper surface of the first source/drain contact 150. Although FIGS. 2 to 4 show that the etching stop layer 170 is formed of a single film, the present disclosure is not limited thereto. In some other embodiments, the etching stop layer 170 may be formed of multiple films. The etching stop layer 170 may include, for example, at least one of silicon oxide, silicon nitride, silicon oxynitride and a low dielectric constant material.

A second interlayer insulating layer 180 may be disposed on the etching stop layer 170. The second interlayer insulating layer 180 may include, for example, at least one of silicon oxide, silicon nitride, silicon oxynitride and a low dielectric constant material.

Referring to FIG. 4, a via 190 may penetrate the second interlayer insulating layer 180 and the etching stop layer 170 in the vertical direction DR3, and be connected to the first source/drain contact 150. The via 190 may include a via barrier layer 191 and a via filling layer 192. The via barrier layer 191 may form the side walls and a bottom surface of the via 190. The via filling layer 192 may be disposed on the via barrier layer 191.

The via barrier layer 191 may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh). However, the present disclosure is not limited thereto.

The via filling layer 192 may include, for example, at least one of aluminum (Al), copper (Cu), tungsten (W), cobalt (Co), ruthenium (Ru), and molybdenum (Mo). However, the present disclosure is not limited thereto.

Because the semiconductor device according to some embodiments of the present disclosure forms the silicide layer 160 by the use of the source/drain region 120 formed of multiple films to reduce the resistance of the source/drain contact 150, the reliability of the semiconductor device can be improved.

Hereinafter, a method for fabricating a semiconductor device according to some embodiments of the present disclosure will be described referring to FIGS. 5 to 17.

FIGS. 5 to 17 are intermediate stage diagrams for explaining a method for fabricating a semiconductor device according to some embodiments of the present disclosure.

Figure 5:
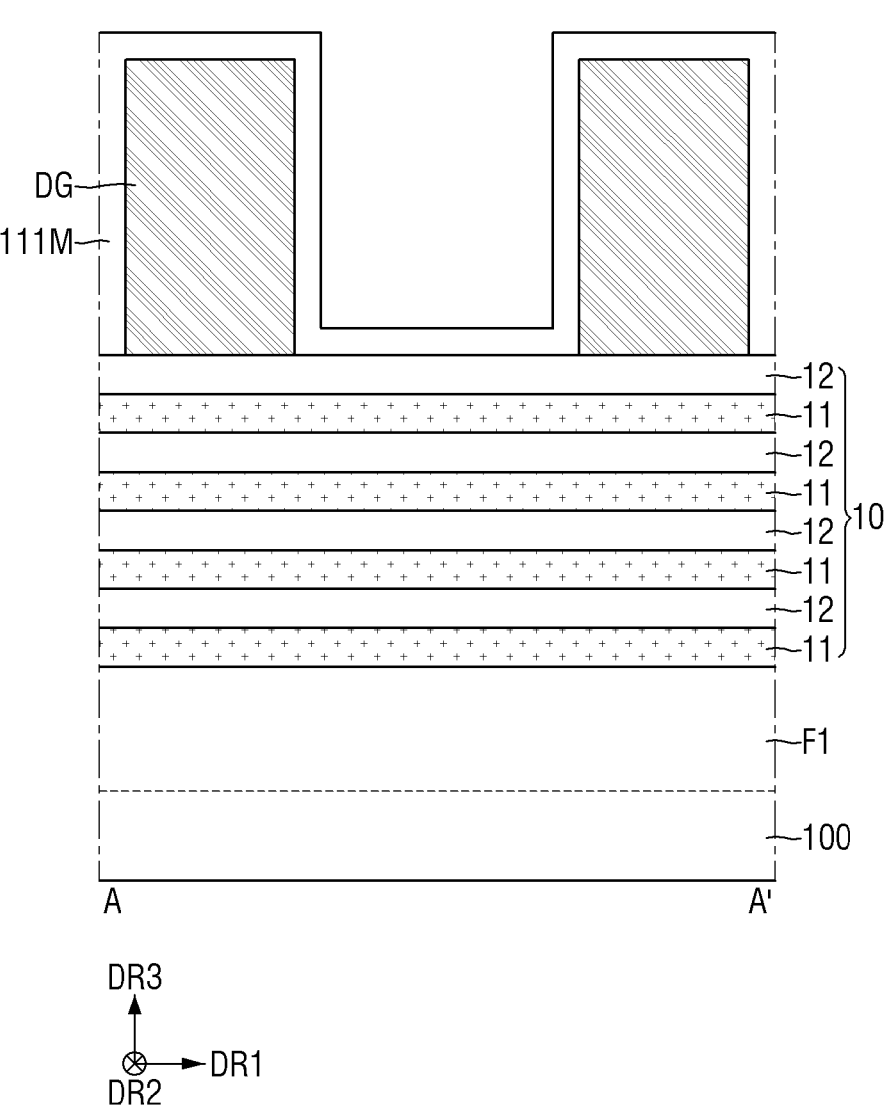

Referring to FIG. 5, a stacked structure 10 in which a first semiconductor layer 11 and a second semiconductor layer 12 are alternately stacked may be formed on the substrate 100. For example, the first semiconductor layer 11 may be formed at the bottom of the stacked structure 10, and the second semiconductor layer 12 may be formed at the top of the stacked structure 10. However, the present disclosure is not limited thereto. The first semiconductor layer 11 may include, for example, silicon germanium (SiGe). The second semiconductor layer 12 may include, for example, silicon (Si).

Subsequently, a plurality of dummy gates DG extending in the second horizontal direction DR2 may be formed on the stacked structure 10. Subsequently, a gate spacer material layer 111M may be formed to cover and conform to stacked structure 10 and the plurality of dummy gates DG. In some embodiments, the gate spacer material layer 111M may have a uniform thickness.

Figure 6:
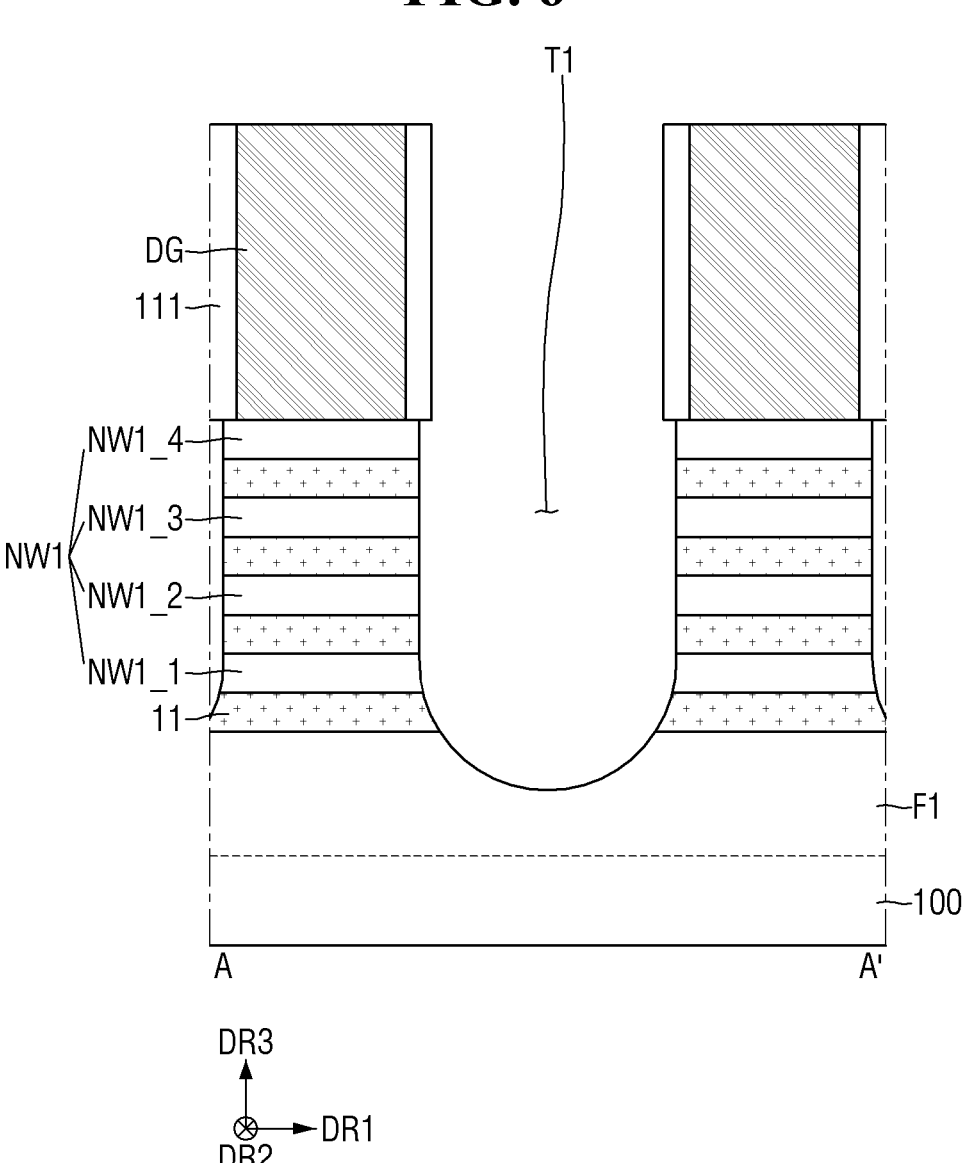

Referring to FIG. 6, a first trench T1 may be formed by etching the stacked structure 10 by the use of the gate spacer material layer (111M of FIG. 5) and a plurality of dummy gates DG as masks. The second semiconductor layers (12 of FIG. 5) separated by the first trench T1 may be spaced apart from each other in the first horizontal direction DR1 (e.g., an X-axis direction). For example, the second semiconductor layer 12 remaining on the first active pattern F1 may form a first plurality of nanosheets NW1.

While the first trench T1 is being formed, the gate spacer material layer 111M formed on the upper surfaces of the plurality of dummy gates DG may be etched. Through such an etching process, a gate spacer 111 may be formed on the side walls of a plurality of dummy gates DG. For example, the first trench T1 may extend into the first active pattern F1.

Figure 7:
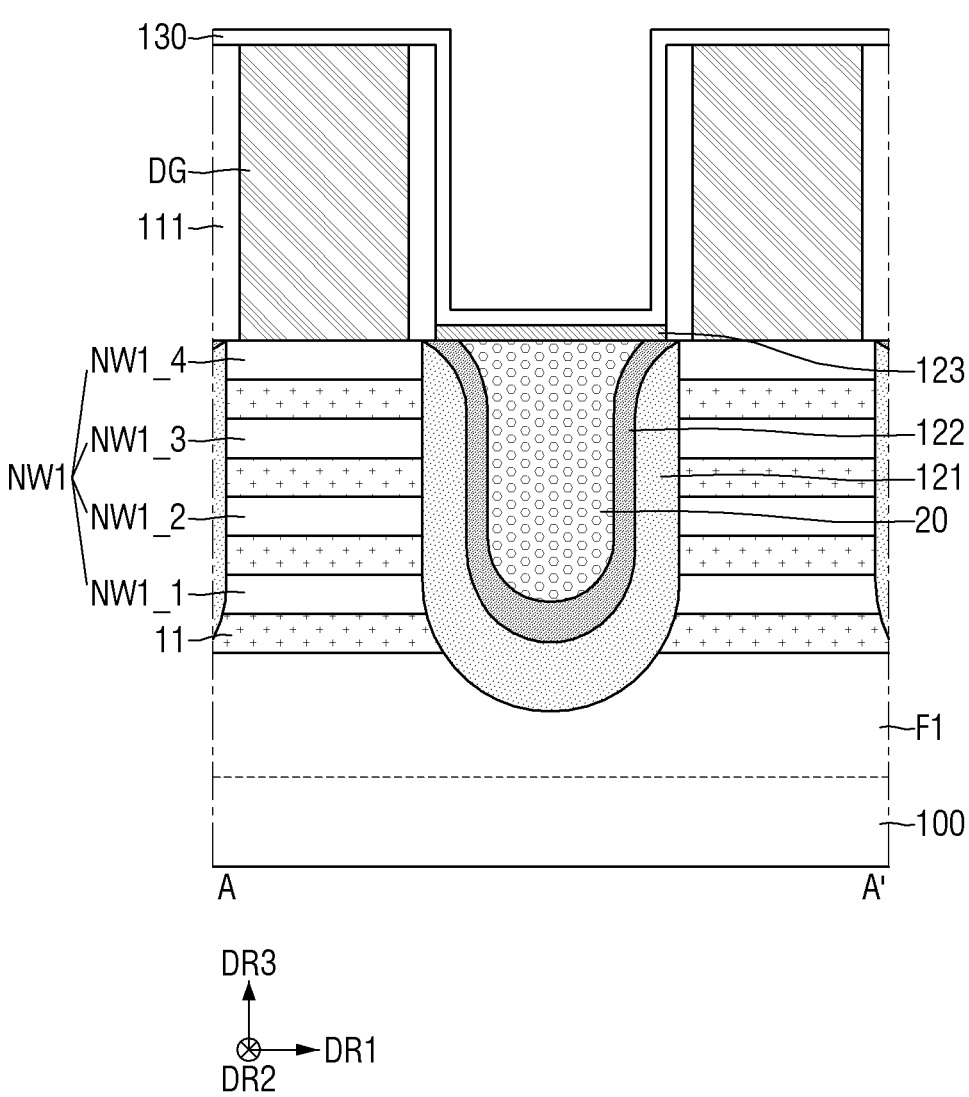
Figure 8:
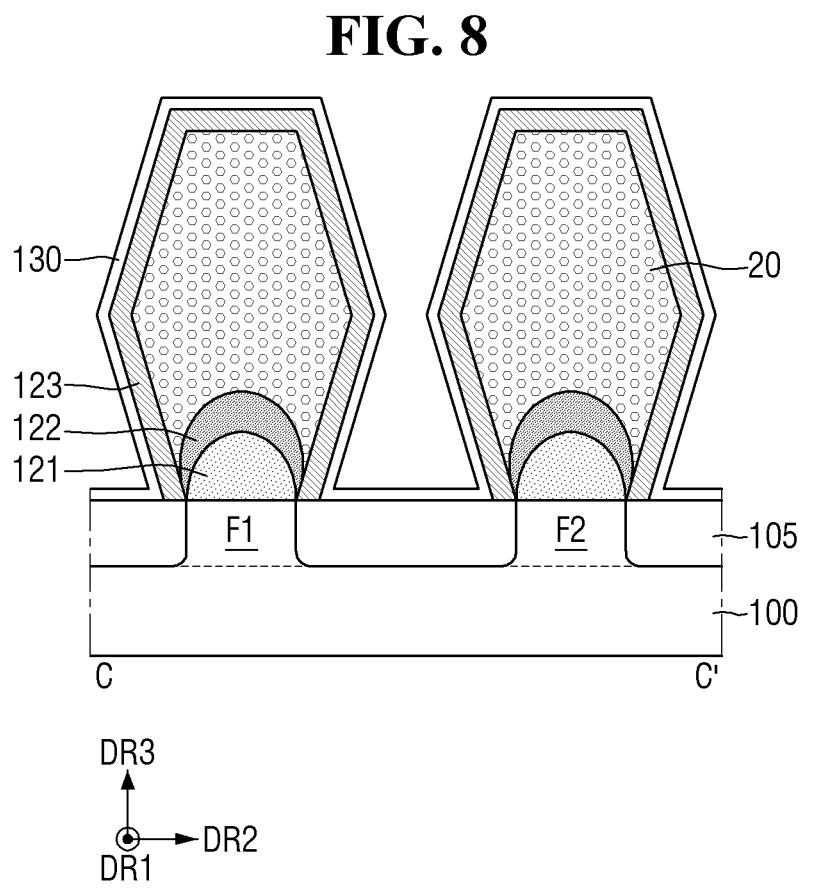

Referring to FIGS. 7 and 8, a first doping layer 121, a second doping layer 122, a sacrificial layer 20, and a first capping layer 123 may be formed sequentially inside the first trench T1 formed between the first plurality of nanosheets NW1 spaced apart from each other in the first horizontal direction DR1.

Specifically, the first doping layer 121 may be formed on each of the first active pattern F1 and the second active pattern F2. The first doping layer 121 may be formed inside the first trench T1 along the side walls of the first plurality of nanosheets NW1 in a vertical direction DR3 (e.g., a Z-axis direction). Subsequently, the second doping layer 122 may be formed on the first doping layer 121. The second doping layer 122 may be formed inside the first trench T1 along the side wall of the first doping layer 121 in the vertical direction DR3.

Subsequently, the sacrificial layer 20 may be formed on the second doping layer 122 inside the first trench T1. The sacrificial layer 20 may include a material having an etching selectivity with the first doping layer 121 and the second doping layer 122. The sacrificial layer 20 may include, for example, silicon germanium (SiGe).

Subsequently, the first capping layer 123 may be formed to cover the exposed second doping layer 122 and sacrificial layer 20. Subsequently, the liner layer 130 may be formed on and conform to the field insulating layer 105, the upper surface of the dummy gate DG, and the gate spacer 111. In some embodiments, the liner layer 130 may have a uniform thickness.

Figure 9:
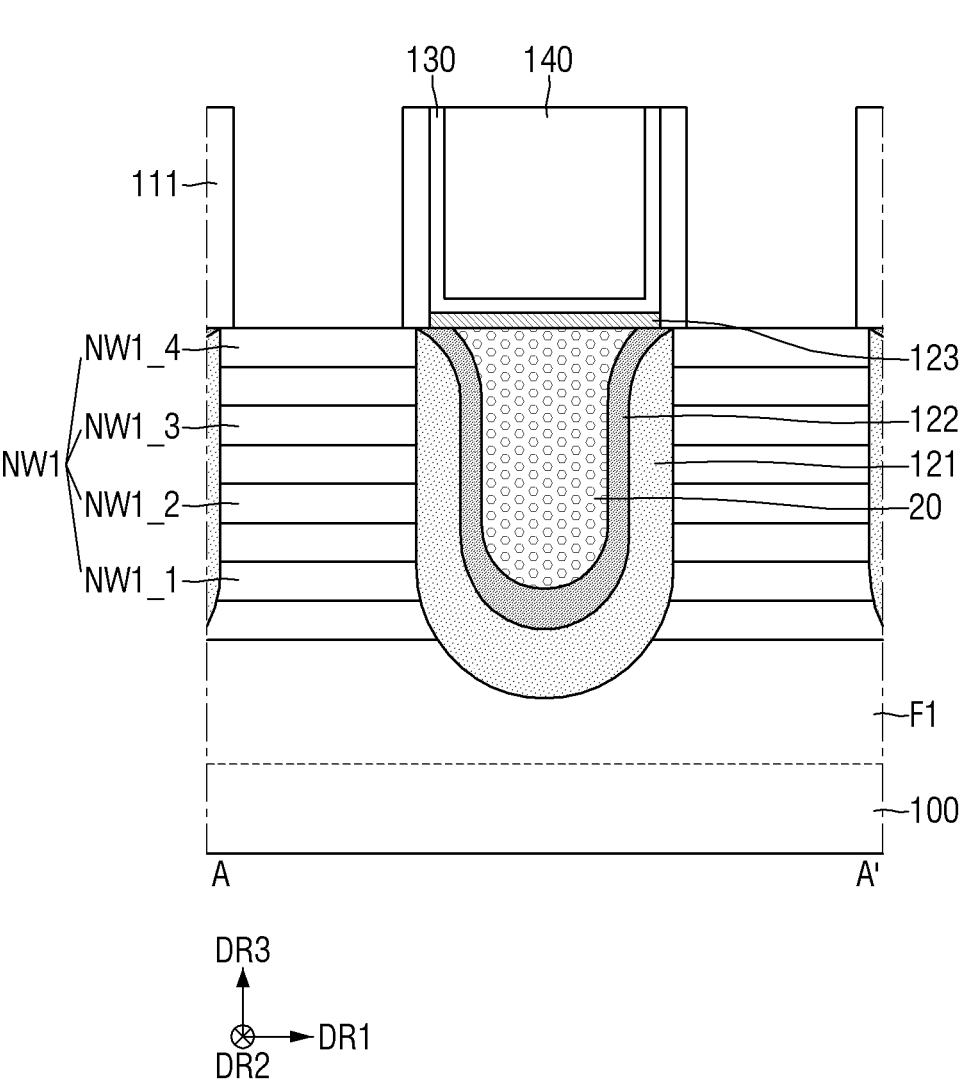
Figure 10:
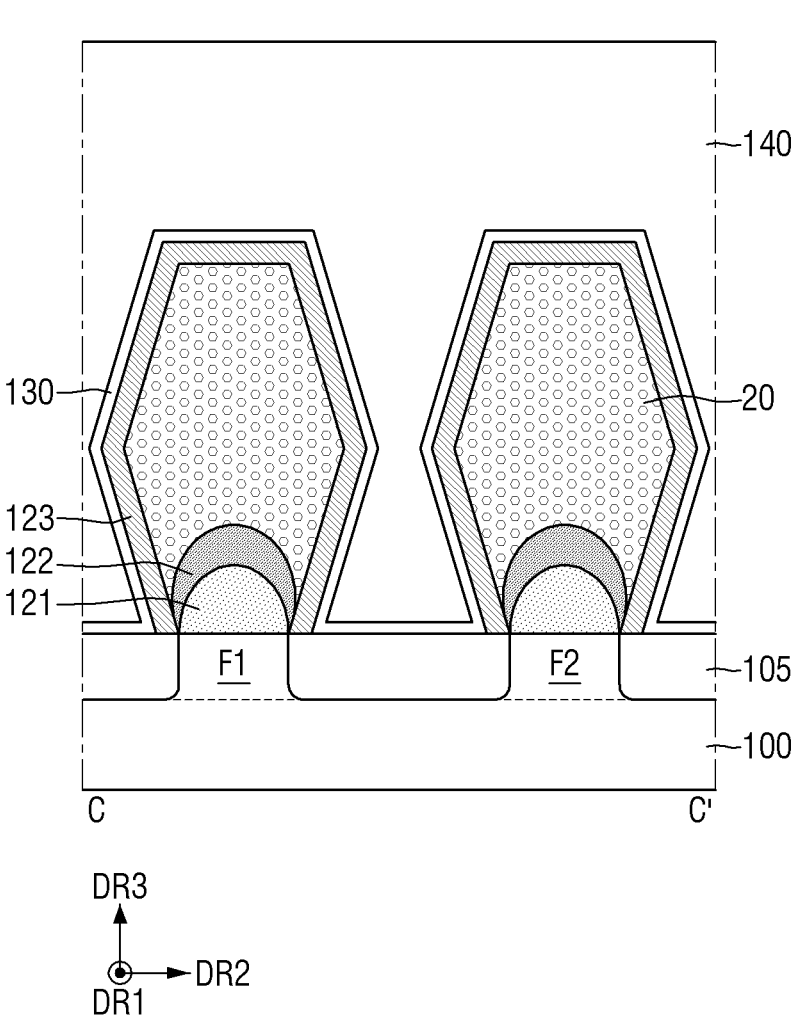

Referring to FIGS. 9 and 10, a first interlayer insulating layer 140 may be formed on a liner layer 130. Subsequently, a part of the first interlayer insulating layer 140, a part of the liner layer 130, and a part of the plurality of dummy gates (DG of FIG. 7) may be etched through a flattening process (e.g., a Chemical Mechanical Planarization (CMP) process) to expose the plurality of dummy gates (DG of FIG. 7). Subsequently, the remaining plurality of dummy gates (DG of FIG. 7) and the first semiconductor layer (11 of FIG. 7) may be removed.

Figure 11:
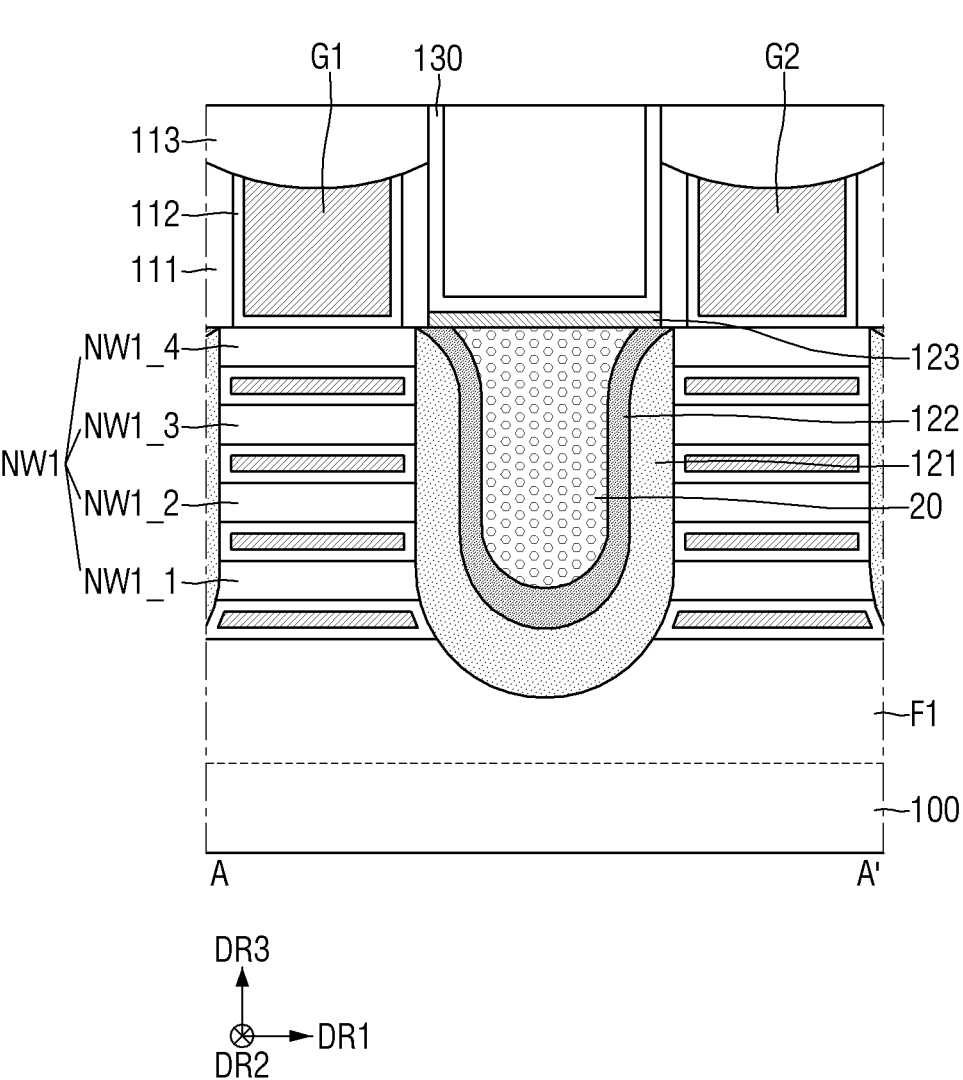

Referring to FIG. 11, a gate insulating layer 112, first and second gate electrodes G1 and G2, and a gate capping pattern 113 may be formed sequentially in the portion in which the plurality of dummy gates (DG of FIG. 7) and the first semiconductor layer (11 of FIG. 7) are removed.

Figure 12:
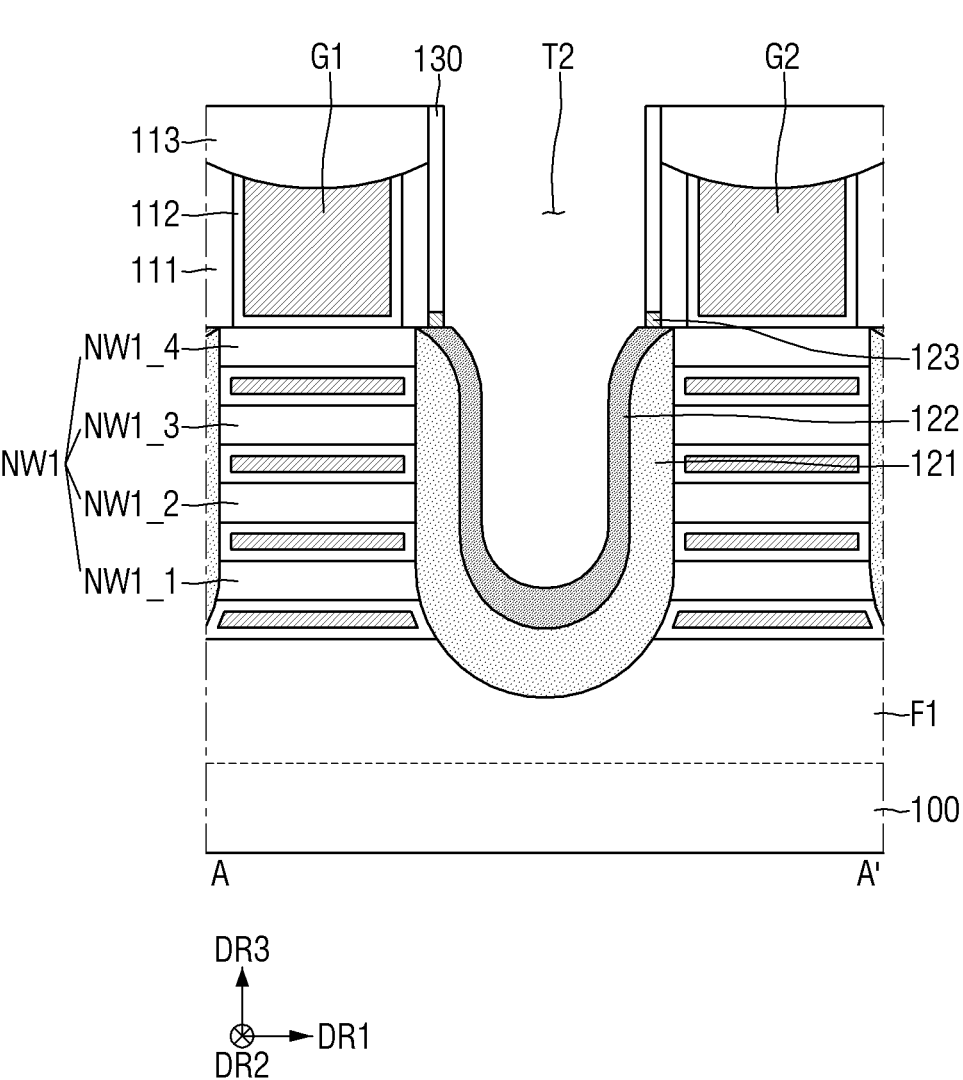
Figure 13:
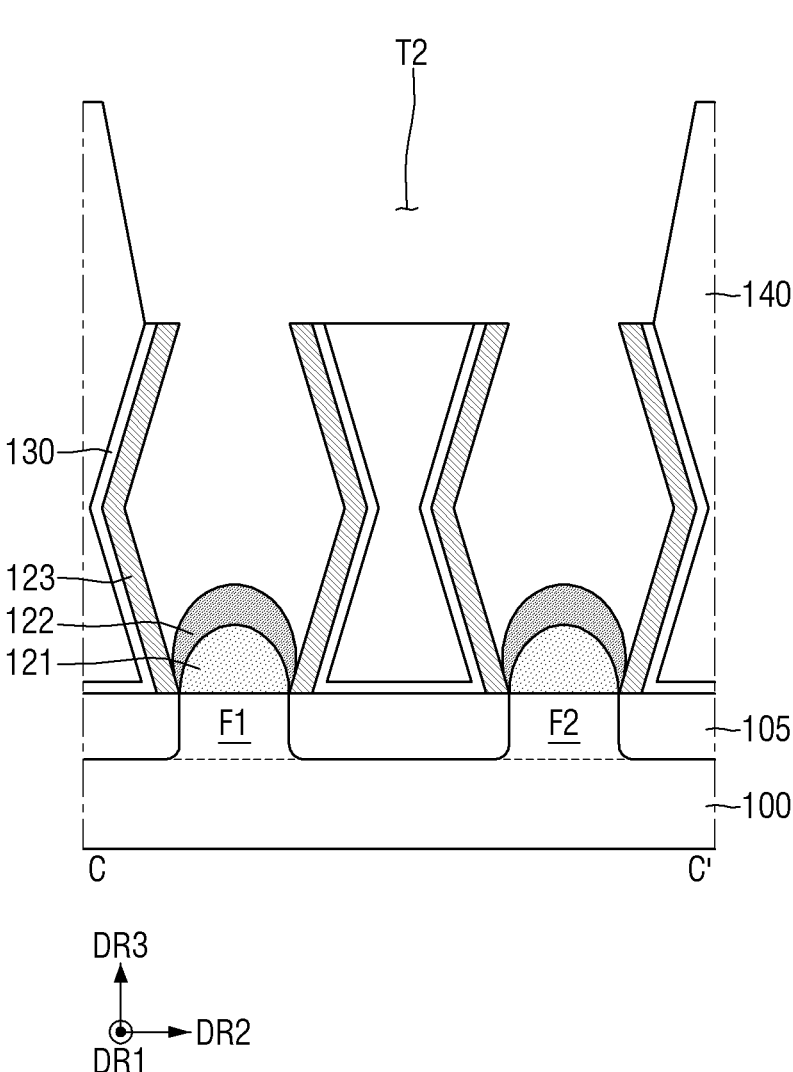

Referring to FIGS. 12 and 13, a first interlayer insulating layer 140 formed between the first gate electrode G1 and the second gate electrode G2 may be etched. Further, the liner layer 130 formed on the upper surface of the sacrificial layer (20 of FIG. 11) and the first capping layer 123 may be etched to expose the upper surface of the sacrificial layer (20 of FIG. 11). Subsequently, the exposed sacrificial layer (20 of FIG. 11) may be removed to form a second trench T2. The second doping layer 122 and the first capping layer 123 may be exposed through the second trench T2.

Figure 14:
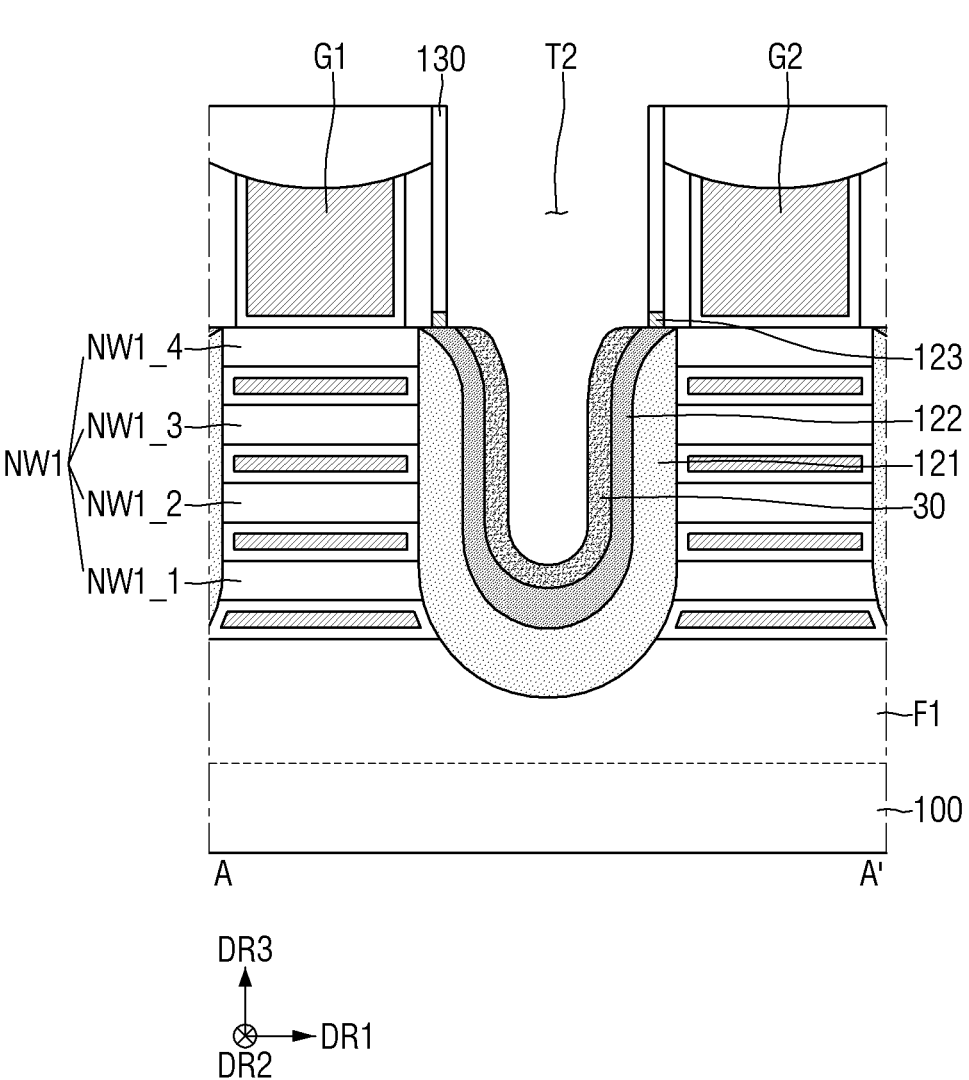
Figure 15:
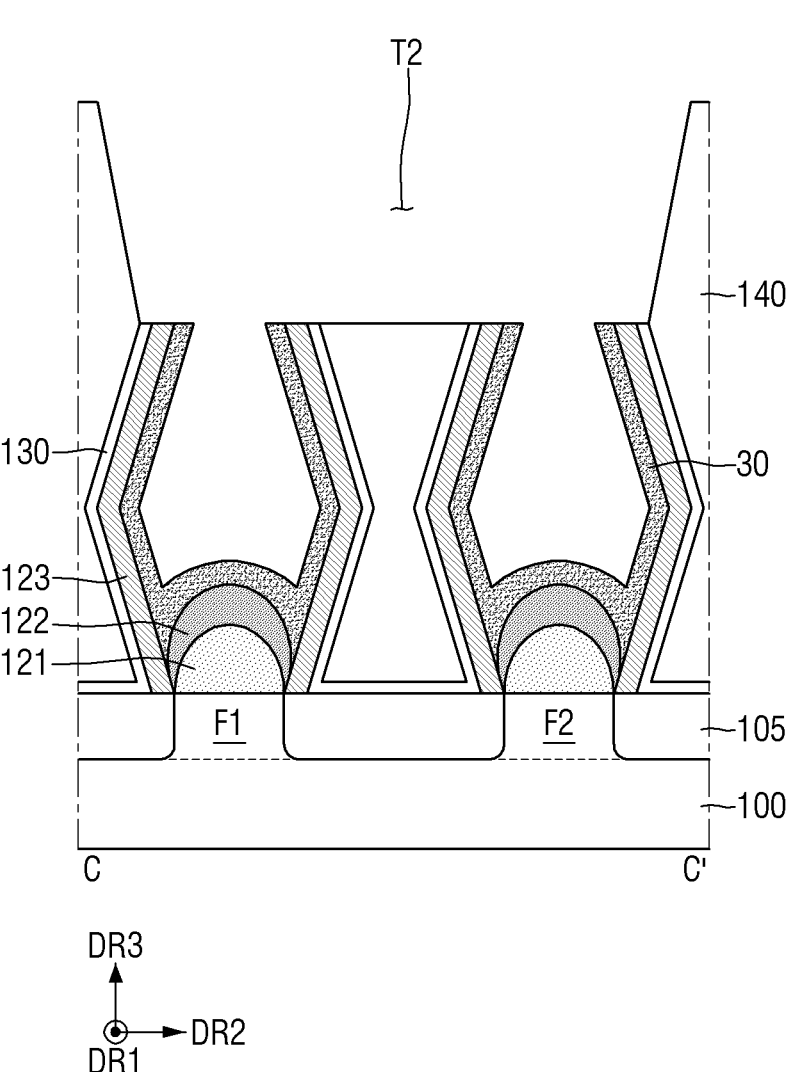

Referring to FIGS. 14 and 15, a pre silicide layer 30 may be formed on the second doping layer 122 and the first capping layer 123.

Figure 16:
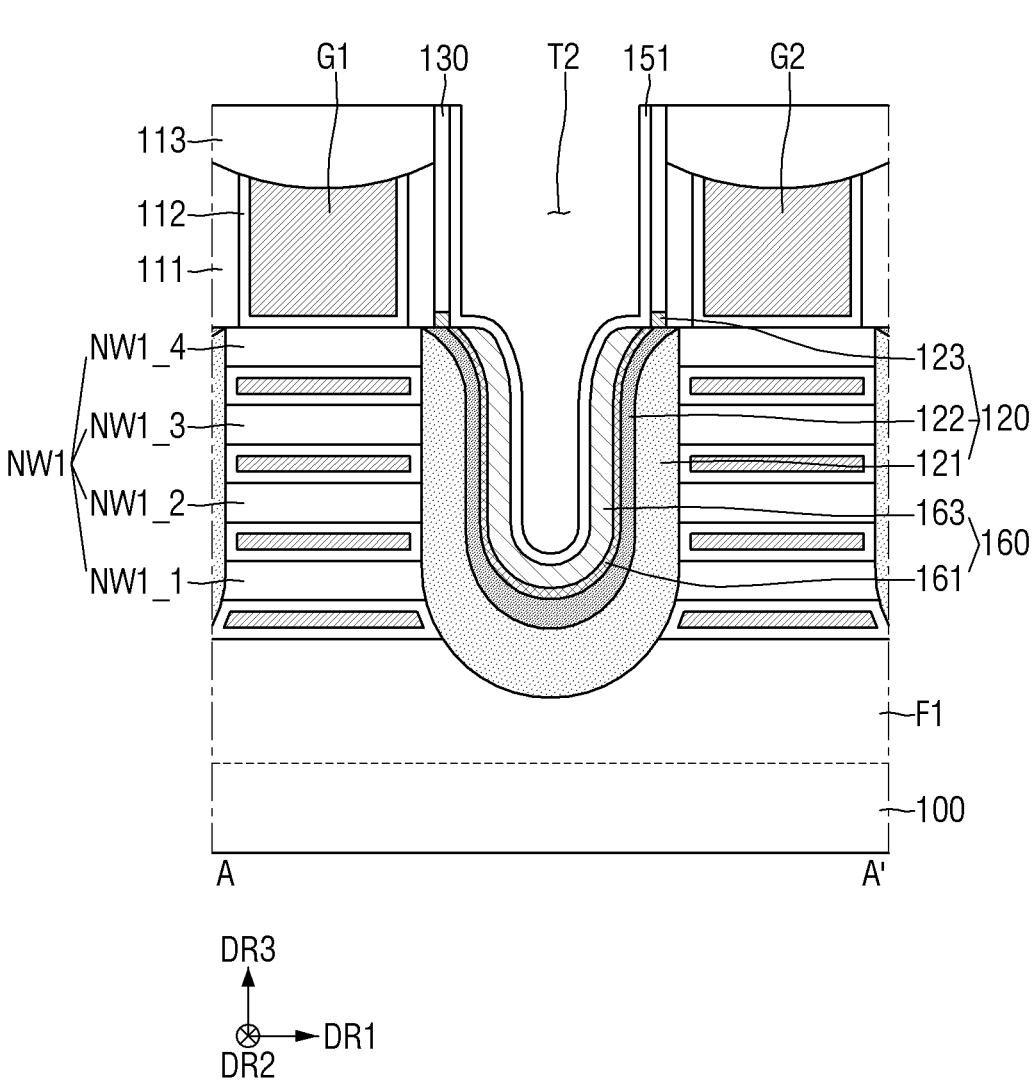
Figure 17:
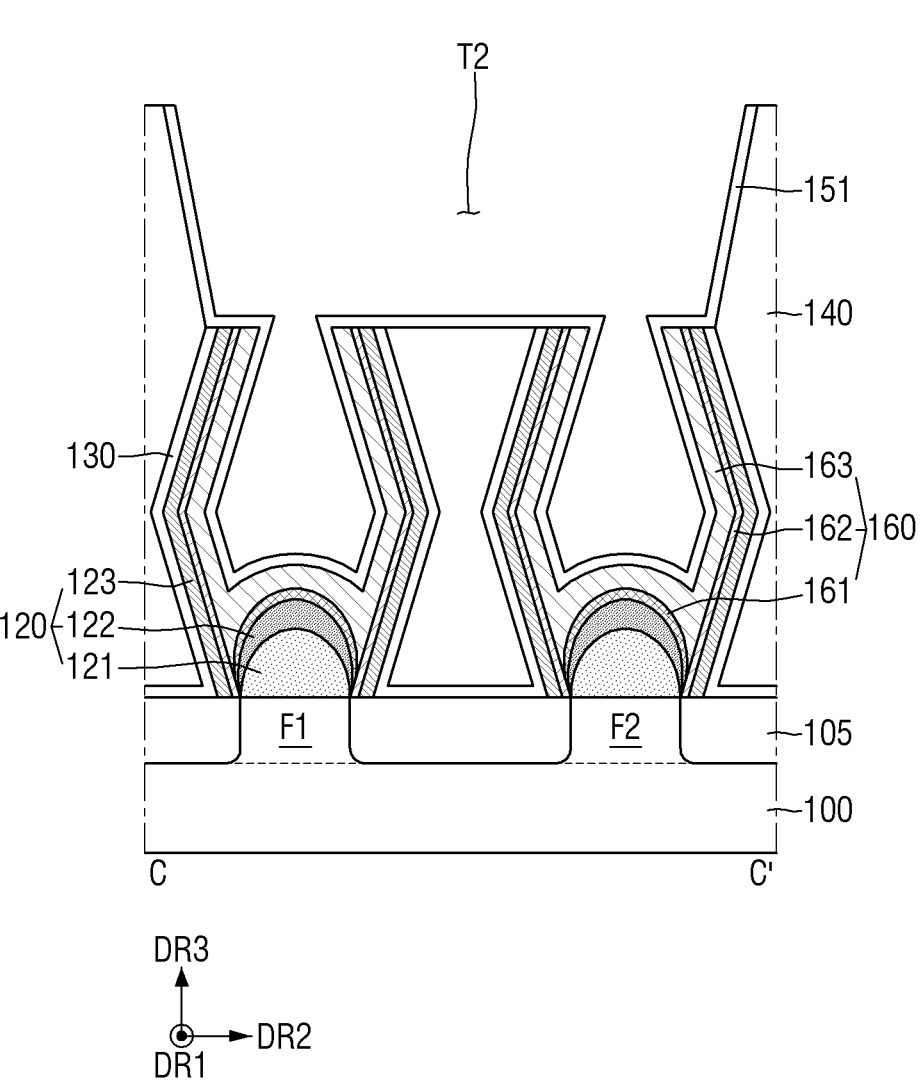

Referring to FIGS. 16 and 17, a first contact barrier layer 151 may be formed on and conform to the side walls and bottom surface of the second trench T2. In some embodiments, the first contact barrier layer 151 may have a uniform thickness.

Subsequently, the first contact barrier layer 151 may be heat-treated to form a first silicide layer 160. For example, the first silicide layer 160 may include first to third layers 161, 162 and 163. For example, a part of the second doping layer 122 which is in contact with the pre silicide layer (30 of FIG. 15) may be silicidized to form the first layer 161. Further, a part of the first capping layer 123 which is in contact with the pre silicide layer (30 of FIG. 15) may be silicidized to form the third layer 163. Further, the pre silicide layer (30 of FIG. 15) may be silicidized to form the second layer 162.

Referring to FIGS. 2 and 4, a first contact filling layer 152 is formed on the first contact barrier layer 151 to fill the inside of the second trench T2, and a first source/drain contact 150 may be formed. Subsequently, an etching stop layer 170 and a second interlayer insulating layer 180 may be sequentially formed on the first interlayer insulating layer 140 and the first source/drain contact 150.

Subsequently, a via 190 which penetrates the second interlayer insulating layer 180 and the etching stop layer 170 in the vertical direction DR3 and is connected to the first source/drain contact 150 may be formed. The semiconductor device shown in FIGS. 1 to 4 may be fabricated through such a fabricating process.

Hereinafter, a semiconductor device according to some other embodiments of the present disclosure will be described referring to FIG. 18. Differences from the semiconductor device shown in FIGS. 1 to 4 will be mainly described. Structures in FIG. 18 that are similar to structures in FIGS. 1-4 are numbered in a similar fashion as those in FIGS. 1-4, but with a "2" prefix instead of a "1" prefix (e.g., first silicide layer 260 in FIG. 18 corresponds to silicide layer 160 in FIGS. 2 and 4).

Figure 18:
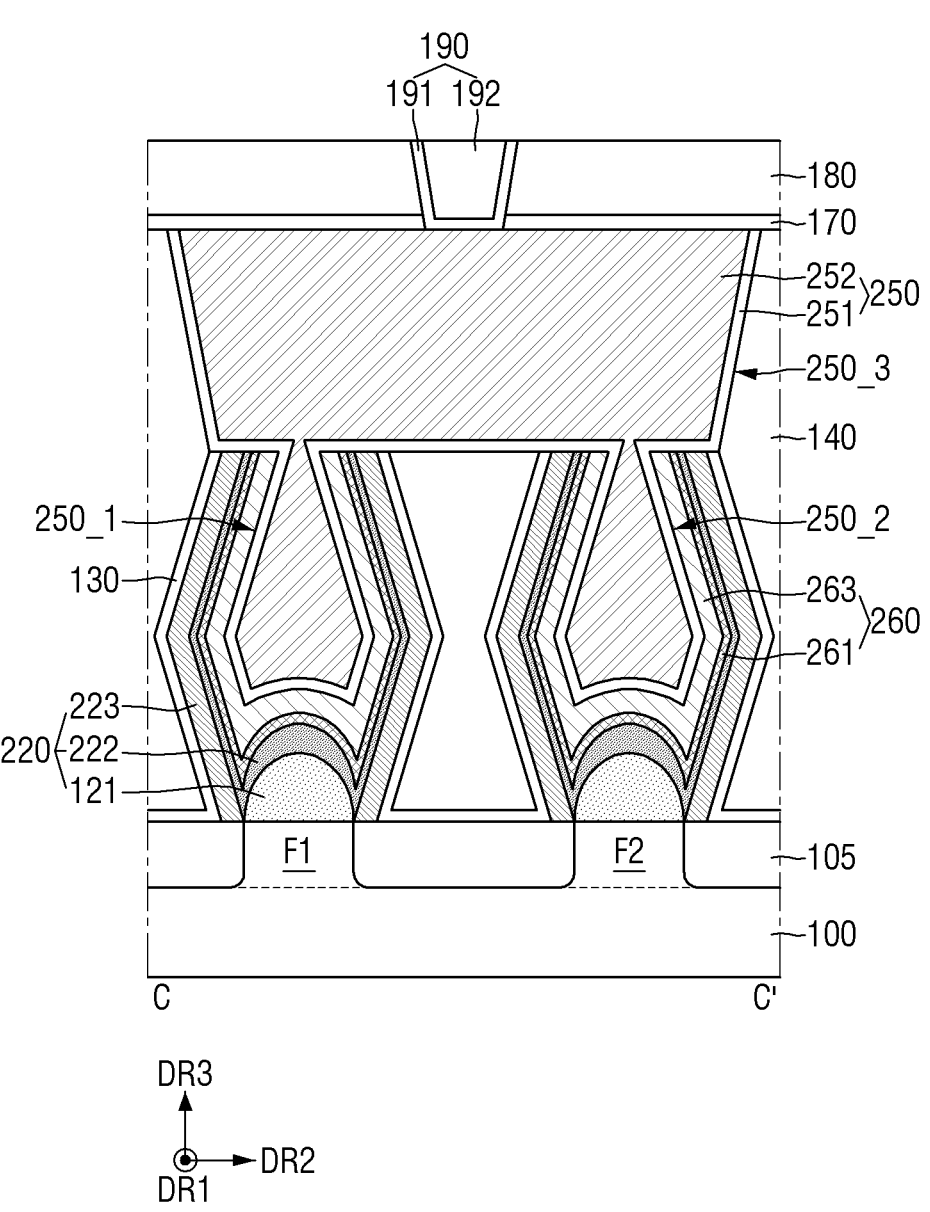
FIG. 18 is a cross-sectional view of a semiconductor device according to some other embodiments of the present disclosure.

FIG. 18 is a cross-sectional view of a semiconductor device according to some other embodiments of the present disclosure.

Referring to FIG. 18, in the semiconductor device according to some other embodiments of the present disclosure, a second doping layer 222 may be disposed between the first silicide layer 260 and the first capping layer 223.

The first source/drain region 220 may include a first doping layer 121, a second doping layer 222 disposed on the first doping layer 121, and a first capping layer 223 disposed along outer walls of the second doping layer 222. The second doping layer 222 may extend along the inner walls of the first capping layer 223 to the upper surface of the first source/drain region 220.

The first silicide layer 260 may include a first layer 261 disposed along the surface of the second doping layer 222, and a second layer 263 disposed between the first layer 261 and the first source/drain contact 250. The first layer 261 may extend along the inner side walls of the second doping layer 222 to the upper surface of the first source/drain region 220. The second layer 263 may extend along the inner side walls of the first layer 261 to the upper surface of the first source/drain region 220.

The first layer 261 and the second layer 263 may include different materials from each other. The first layer 261 may include a material in which a part of the second doping layer 222 is silicidized. The second layer 263 may include a material in which silicon (Si) doped with the first impurity at a third concentration higher than the second concentration is silicidized.

The first source/drain contact 250 may include a first portion 250_1 surrounded by the first source/drain region 220 disposed on the first active pattern F1, a second portion 250_2 surrounded by the first source/drain region 220 disposed on the second active pattern F2, and a third portion 250_3 that connects the first portion 250_1 and the second portion 250_2. The first source/drain contact 250 may include a first contact barrier layer 251 that forms the side walls and the bottom surface, and a first contact filling layer 252 disposed on the first contact barrier layer 251.

Hereinafter, an alternate method for fabricating a semiconductor device according to some other embodiments of the present disclosure will be described referring to FIGS. 19 to 28. Differences from the method for fabricating the semiconductor device shown in FIGS. 5 to 17 will be mainly described.

FIGS. 19 to 28 are intermediate stage diagrams for explaining a method for fabricating a semiconductor device according to alternate embodiments of the present disclosure.

Figure 19:
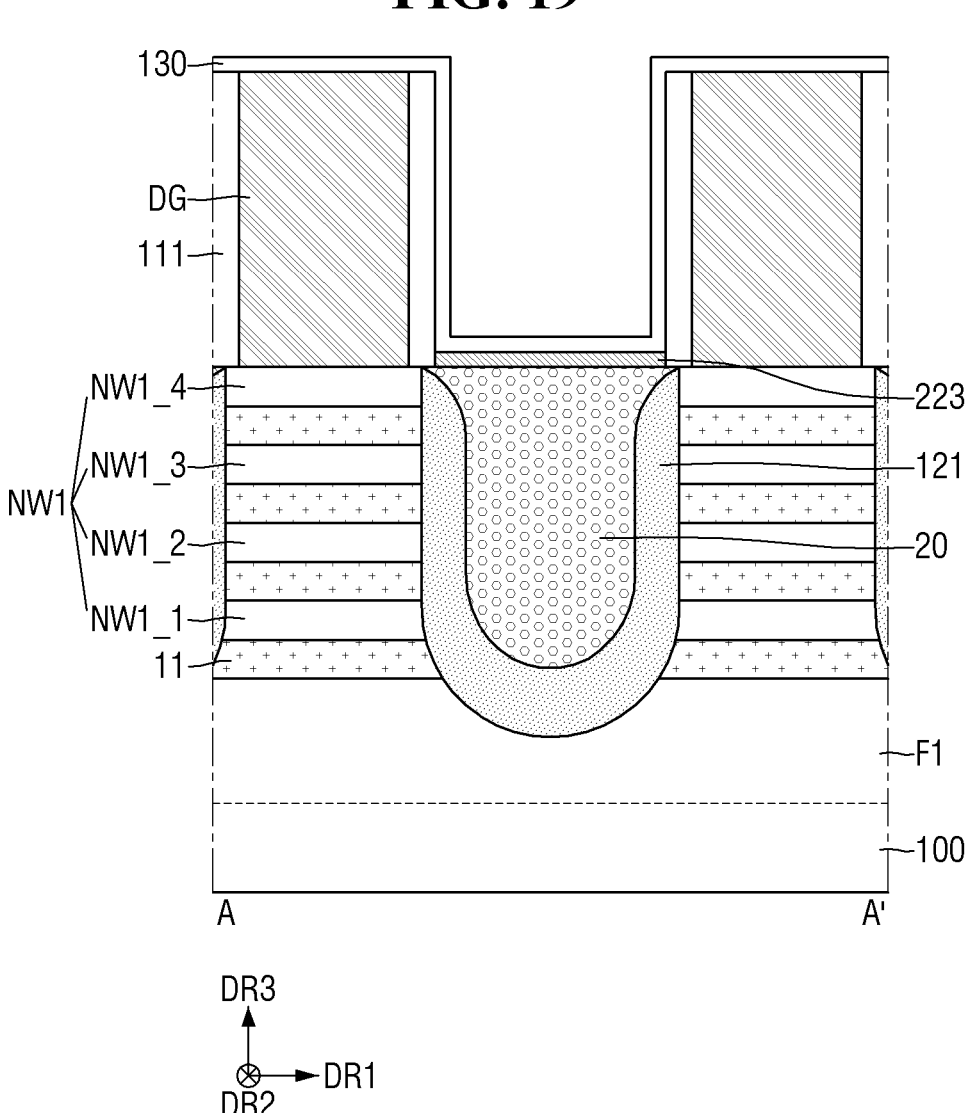
FIGS. 19 to 28 are intermediate stage diagrams for explaining a method for fabricating a semiconductor device according to some other embodiments of the present disclosure.
Figure 20:
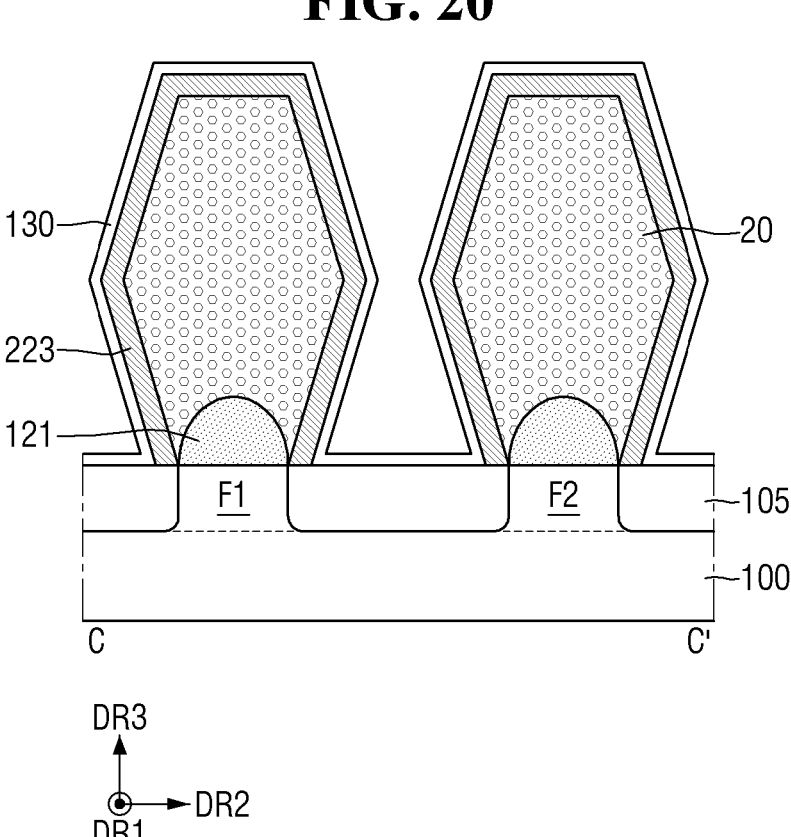

Referring to FIGS. 19 and 20, after the fabricating processes shown in FIGS. 5 and 6 are performed, a first doping layer 121, a sacrificial layer 20, and a first capping layer 223 may be continuously formed inside the first trench T1 formed between the first plurality of nanosheets NW1 spaced apart in the first horizontal direction DR1 (e.g., an X-axis direction).

Specifically, the first doping layer 121 may be formed on each of the first active pattern F1 and the second active pattern F2. Subsequently, the sacrificial layer 20 may be formed on the first doping layer 121 inside the first trench T1. The sacrificial layer 20 may include a material having an etching selectivity with the first doping layer 121.

Subsequently, the first capping layer 223 may be formed to cover the exposed first doping layer 121 and sacrificial layer 20. Subsequently, the liner layer 130 may be formed on the field insulating layer 105, the upper surface of the dummy gate DG, and the gate spacer 111.

Figure 21:
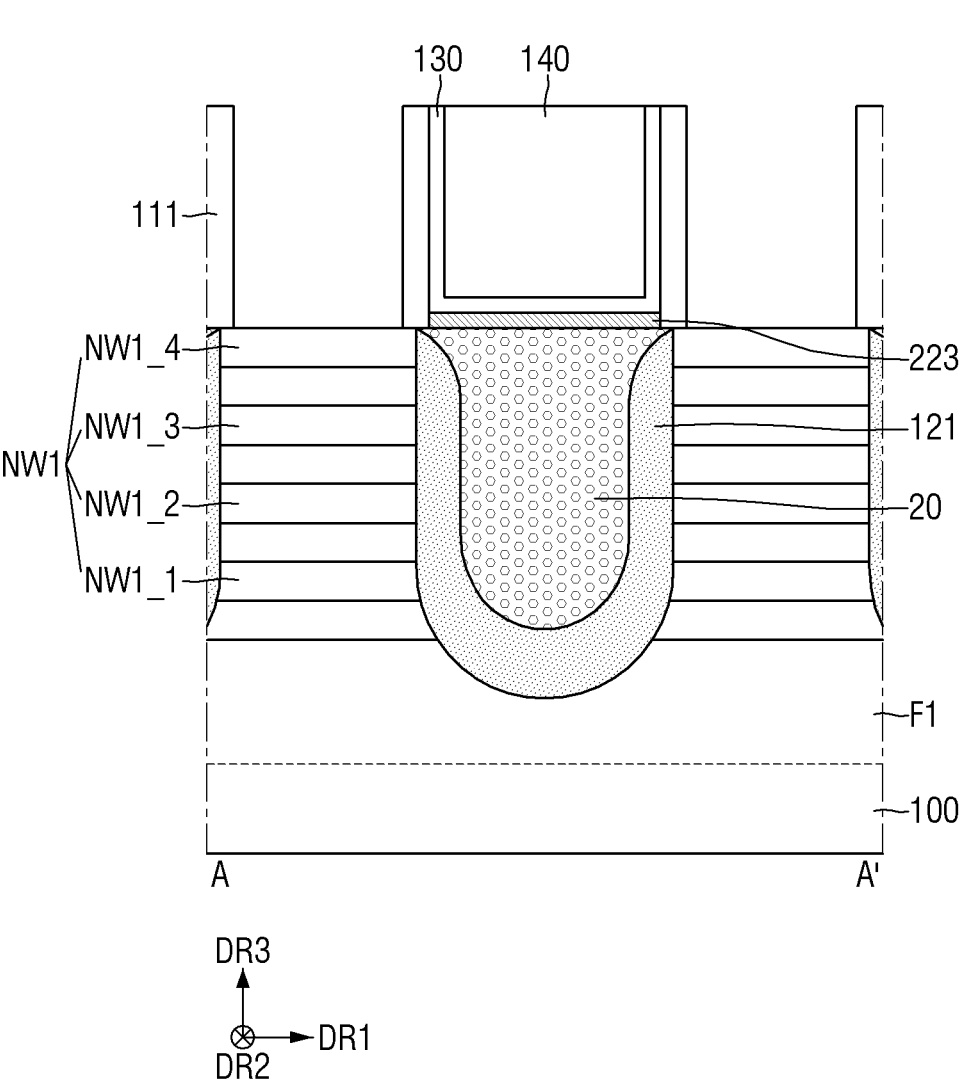

Referring to FIG. 21, a first interlayer insulating layer 140 may be formed on a liner layer 130. Subsequently, a part of the first interlayer insulating layer 140, a part of the liner layer 130, and a part of a plurality of dummy gates (DG of FIG. 19) may be etched through a flattening process (e.g., a CMP process) to expose the plurality of dummy gates (DG of FIG. 19). Subsequently, the remaining plurality of dummy gates (DG of FIG. 19) and the first semiconductor layer (11 of FIG. 19) may be removed.

Figure 22:
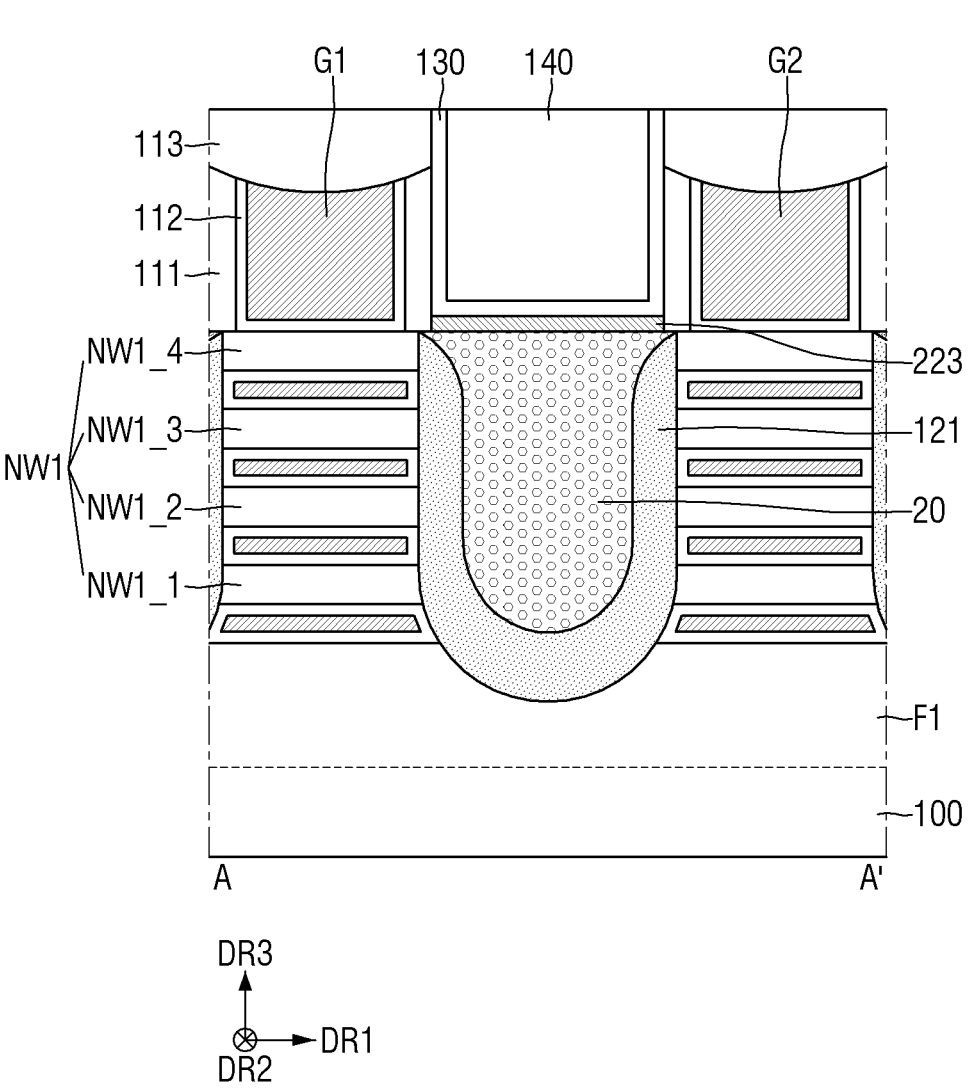

Referring to FIG. 22, agate insulating layer 112, first and second gate electrodes G1 and G2, and a gate capping pattern 113 may be formed sequentially in the portion from which the plurality of dummy gates (DG of FIG. 19) and the first semiconductor layer (11 of FIG. 19) are removed.

Figure 23:
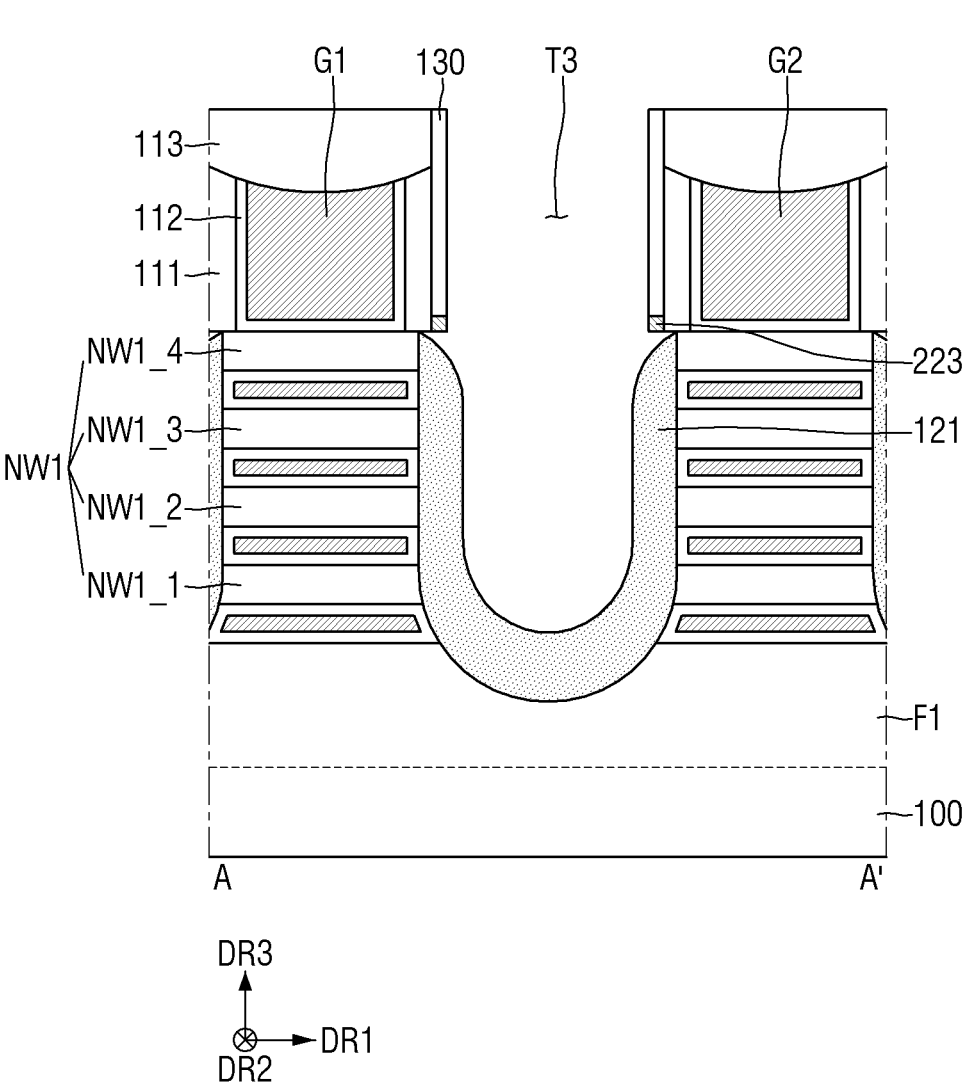
Figure 24:
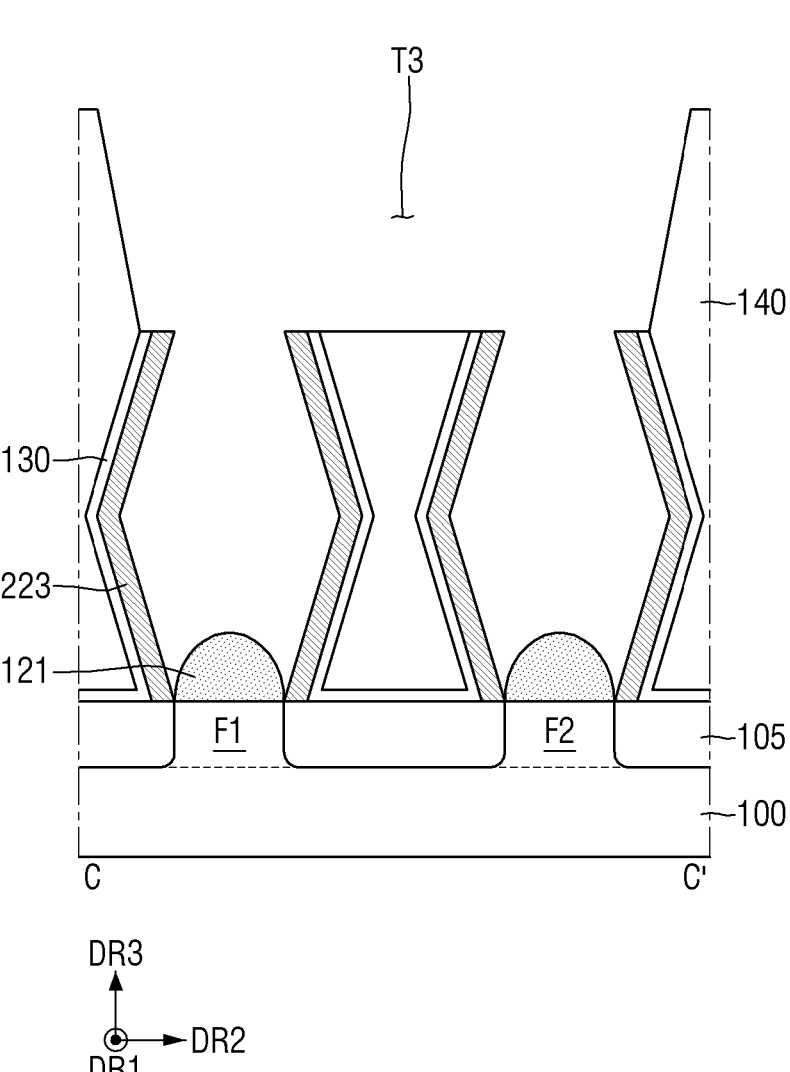

Referring to FIGS. 23 and 24, for example, the first interlayer insulating layer 140 formed between the first gate electrode G1 and the second gate electrode G2 may be etched. Further, the liner layer 130 and the first capping layer 123 formed on the upper surface of the sacrificial layer (20 of FIG. 22) may be etched to expose the upper surface of the sacrificial layer (20 of FIG. 22). Subsequently, the exposed sacrificial layer (20 of FIG. 22) may be removed to form a third trench T3. The first doping layer 121 and the first capping layer 223 may be exposed through the third trench T3.

Figure 25:
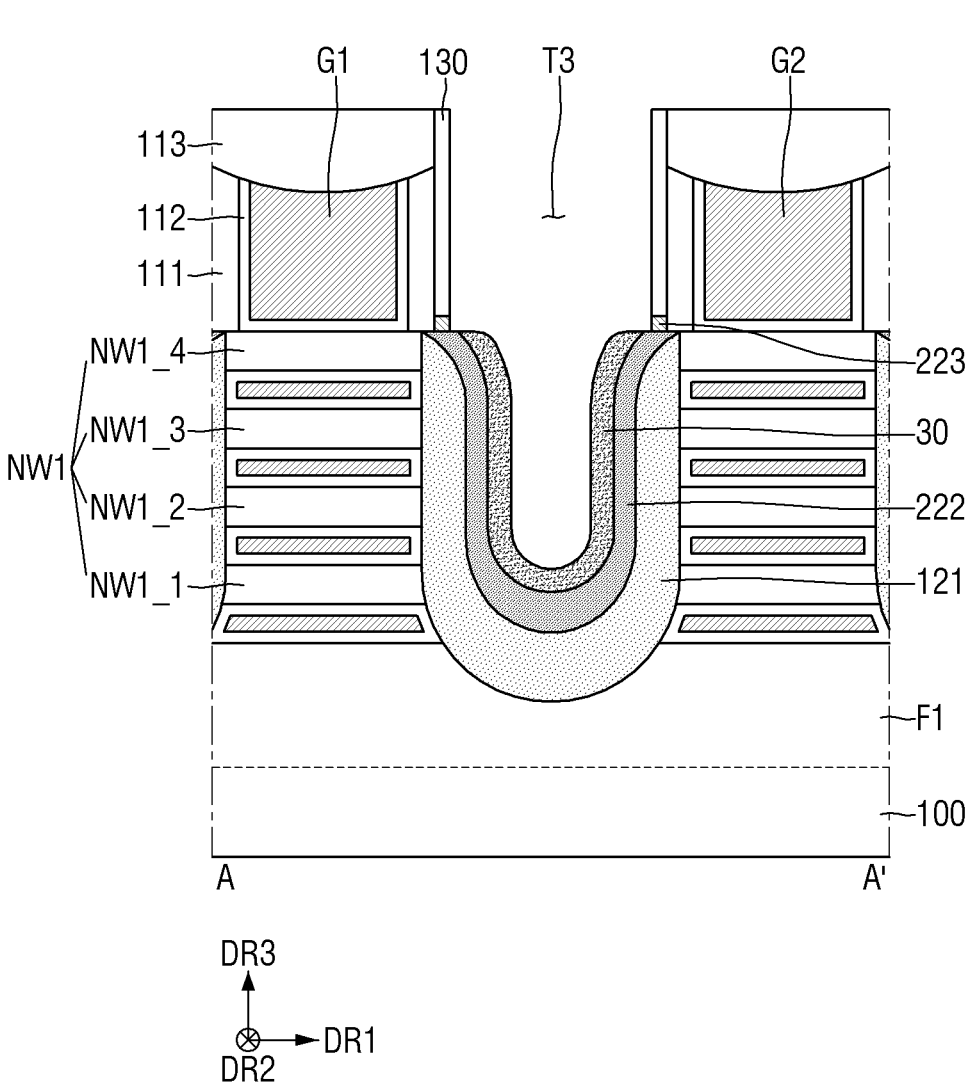
Figure 26:
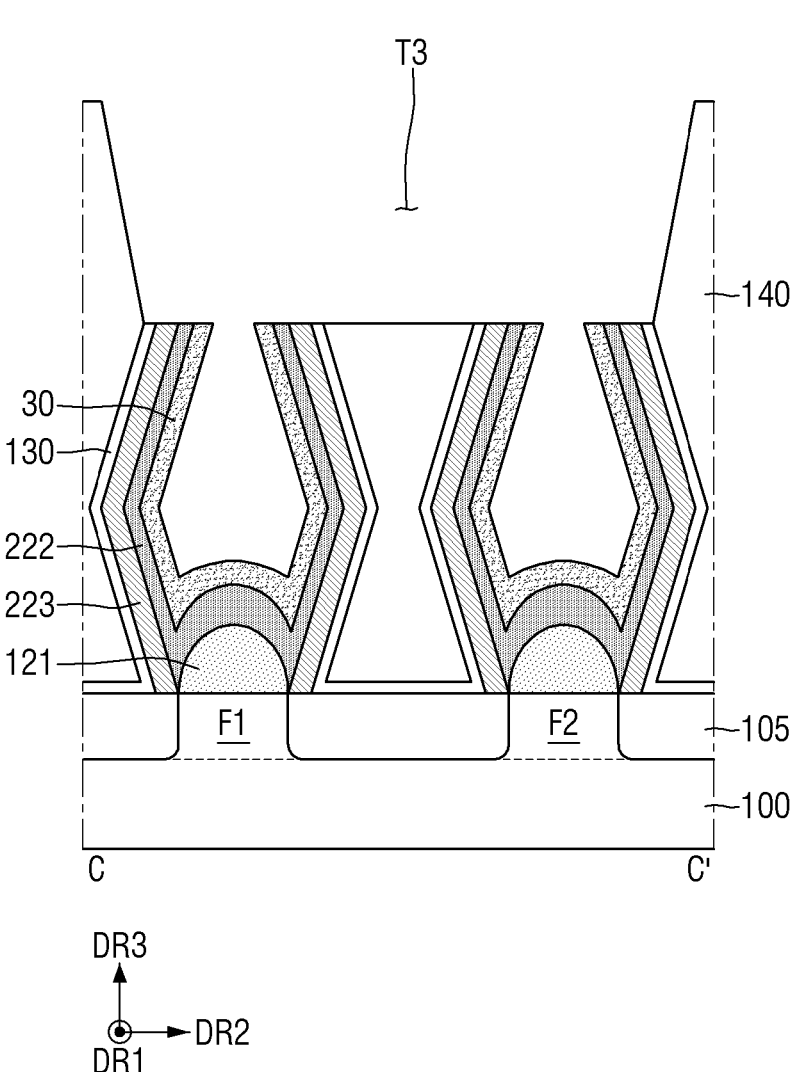

Referring to FIGS. 25 and 26, a second doping layer 222 and a pre silicide layer 30 may be sequentially formed on the first doping layer 121 and the first capping layer 223.

Figure 27:
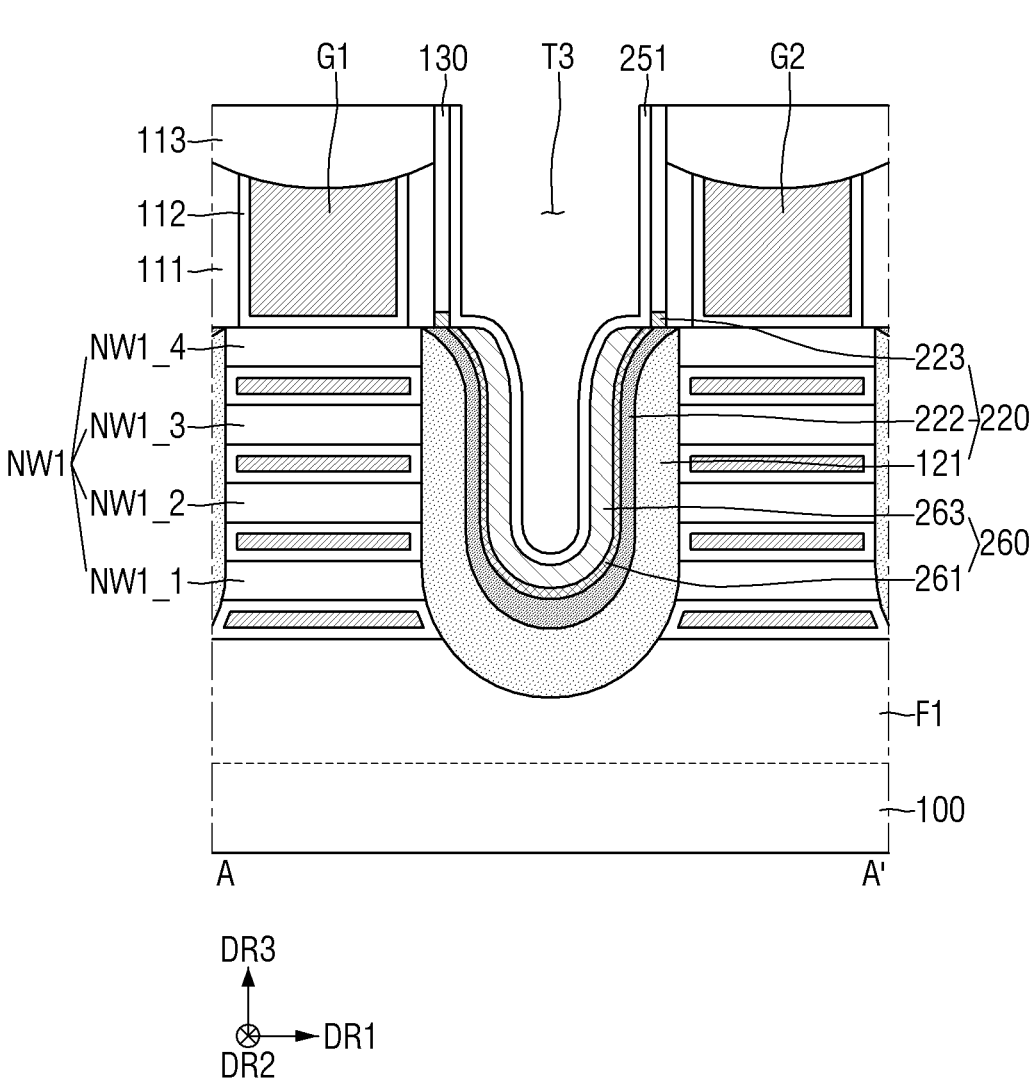
Figure 28:
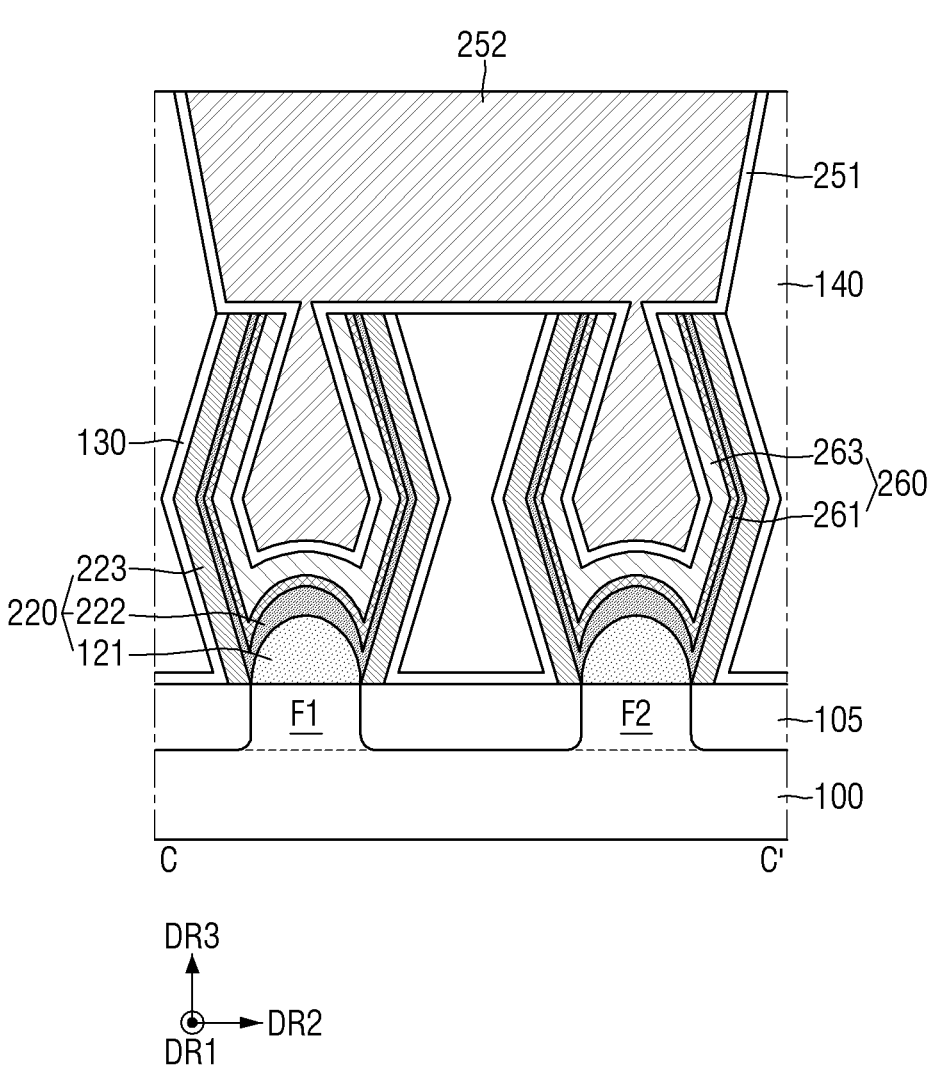

Referring to FIGS. 27 and 28, a first contact barrier layer 251 may be formed on and conform to the side walls and bottom surface of the third trench T3. In some embodiments, the first contact barrier layer 251 may have a uniform thickness.

Subsequently, the first contact barrier layer 251 may be heat-treated to form the first silicide layer 260. For example, the first silicide layer 260 may include a first layer 261 and a second layer 263. For example, a part of the second doping layer 222 that is in contact with the pre silicide layer (30 of FIG. 26) may be silicidized to form the first layer 261. Further, the pre silicide layer (30 of FIG. 26) may be silicidized to form a second layer 263.

Referring to FIG. 18 together with FIGS. 27 and 28, a first contact filling layer 252 is formed on the first contact barrier layer 251 to fill the inside of a third trench T3, and a first source/drain contact 250 may be formed. Subsequently, the etching stop layer 170 and the second interlayer insulating layer 180 may be sequentially formed on the first interlayer insulating layer 140 and the first source/drain contact 250.

Subsequently, the via 190 which penetrates the second interlayer insulating layer 180 and the etching stop layer 170 in the vertical direction DR3 and is connected to the first source/drain contact 250 may be formed. The semiconductor device shown in FIG. 18 may be fabricated through such a fabricating process.

Hereinafter, the semiconductor device according to some other embodiments of the present disclosure will be described referring to FIG. 29. Differences from the semiconductor devices shown in FIGS. 1 to 4 will be mainly described. Structures in FIG. 29 that are similar to structures in FIGS. 1-4 are numbered in a similar fashion as those in FIGS. 1-4, but with a "3" prefix instead of a "1" prefix (e.g., first silicide layer 360 in FIG. 29 corresponds to silicide layer 160 in FIGS. 2 and 4).

Figure 29:
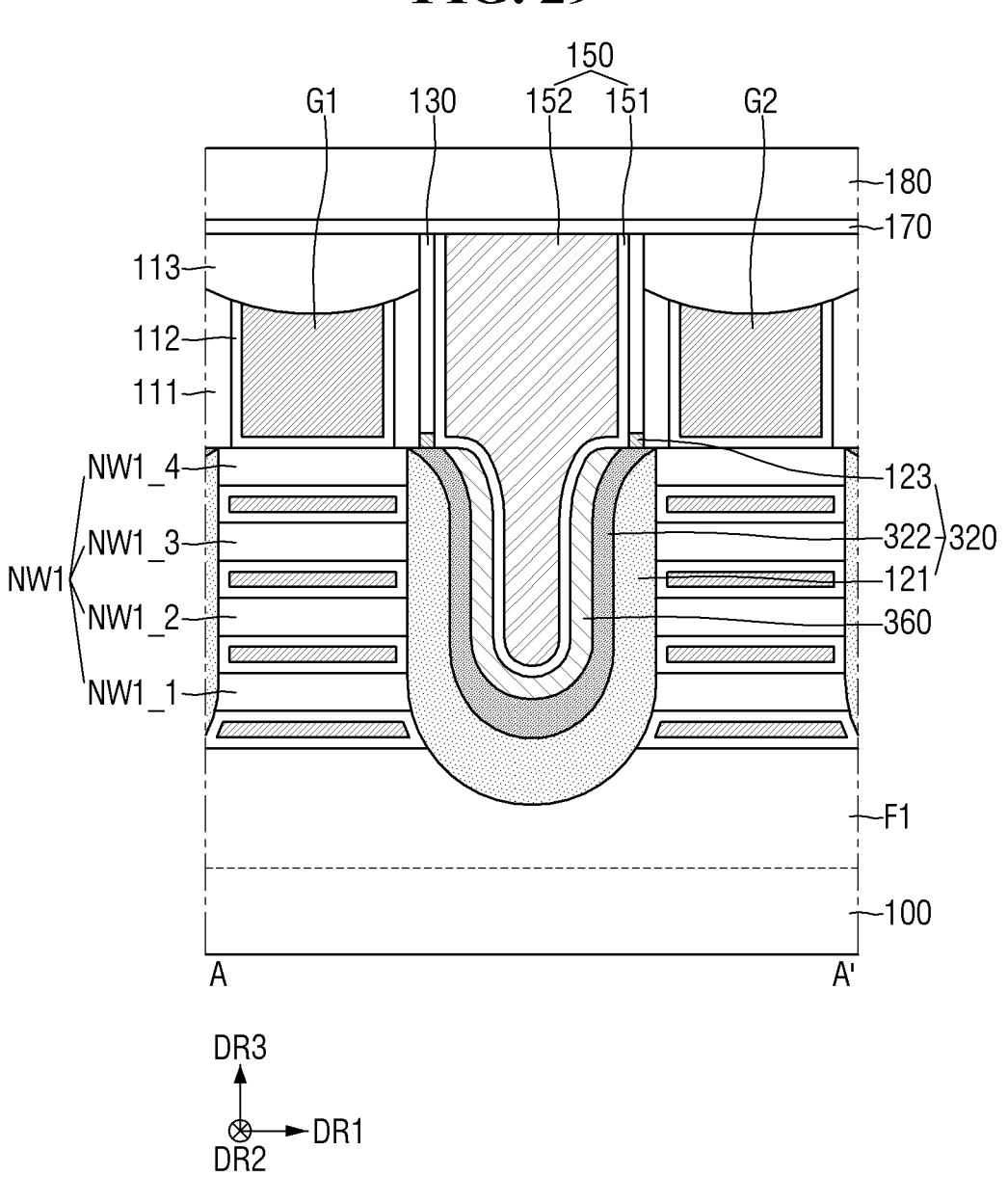
FIG. 29 is a cross-sectional view of a semiconductor device according to some other embodiments of the present disclosure.

FIG. 29 is a cross-sectional view of a semiconductor device according to alternate embodiments of the present disclosure.

Referring to FIG. 29, in the semiconductor device according to some other embodiments of the present disclosure, a first silicide layer 360 may be formed of a single film.

A first source/drain region 320 may include a first doping layer 121, and a second doping layer 322 disposed on the first doping layer. Further, as shown in FIG. 4, the first source/drain region 320 may include a first capping layer 123 that forms side walls of the first source/drain region 320.

The first silicide layer 360 may be formed as a single film between the second doping layer 322 and the first source/drain contact 150. The first silicide layer 360 may include a material in which silicon (Si) doped with the first impurity at a third concentration higher than the second concentration is silicidized.

Hereinafter, a semiconductor device according to some other embodiments of the present disclosure will be described referring to FIG. 30. Differences from the semiconductor devices shown in FIGS. 1 to 4 will be mainly described. Structures in FIG. 30 that are similar to structures in FIGS. 1-4 are numbered in a similar fashion as those in FIGS. 1-4, but with a "4" prefix instead of a "1" prefix (e.g., first silicide layer 460 in FIG. 30 corresponds to silicide layer 160 in FIGS. 2 and 4).

Figure 30:
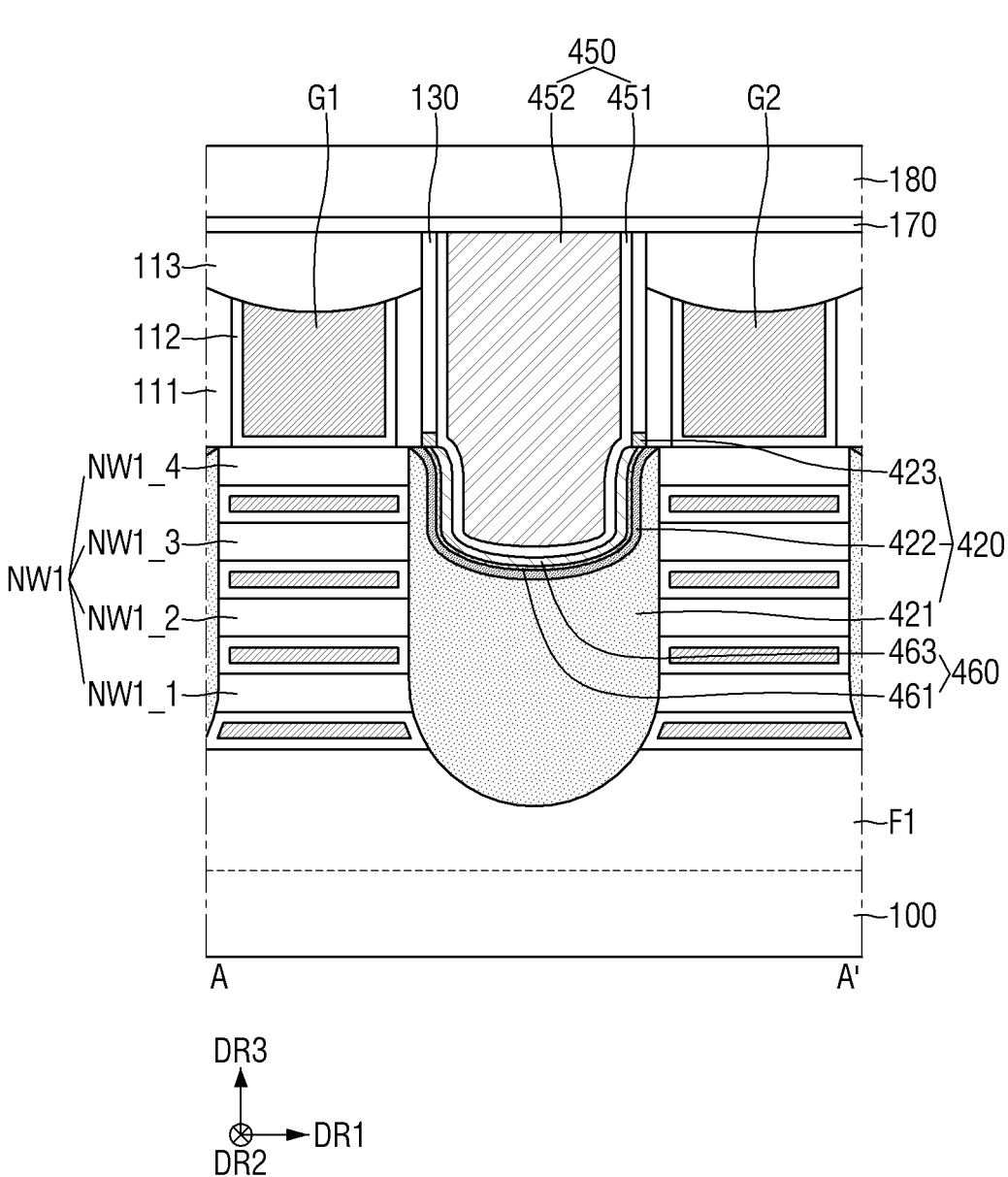
FIG. 30 is a cross-sectional view of a semiconductor device according to some other embodiments of the present disclosure.

FIG. 30 is a cross-sectional view of a semiconductor device according to some other embodiments of the present disclosure.

Referring to FIG. 30, in the semiconductor device according to some other embodiments of the present disclosure, in the cross section that is cut in the first horizontal direction DR1 along a center line (CL of FIG. 1) that equally divides the first active pattern F1 in the second horizontal direction DR2 (e.g., a Y-axis direction), the bottom surface of the second doping layer 422 may be formed between the second nanosheet NW1_2 and the third nanosheet NW1_3

A first source/drain region 420 may include a first doping layer 421, and a second doping layer 422 disposed on the first doping layer 421. Also, similarly to the example shown in FIG. 4, the first source/drain region 420 may include a first capping layer 423 that forms side walls of the first source/drain region 420.

A first silicide layer 460 may be disposed between the first source/drain region 420 and the first source/drain contact 450. The first silicide layer 460 may include a first layer 461 that is in contact with the second doping layer 422, a second layer (not shown) extending to the upper surface of the first source/drain region 420 along the side walls of the first capping layer 423 similarly to that shown in FIG. 4, and a third layer 463 disposed between the first layer 461 and the first source/drain contact 450.

The first source/drain contact 450 may include a first contact barrier layer 451 that forms side walls and a bottom surface, and a first contact filling layer 452 disposed on the first contact barrier layer 451.

Hereinafter, a semiconductor device according to some other embodiments of the present disclosure will be described referring to FIGS. 31 and 32. Differences from the semiconductor devices shown in FIGS. 1 to 4 will be mainly described.

Figure 31:
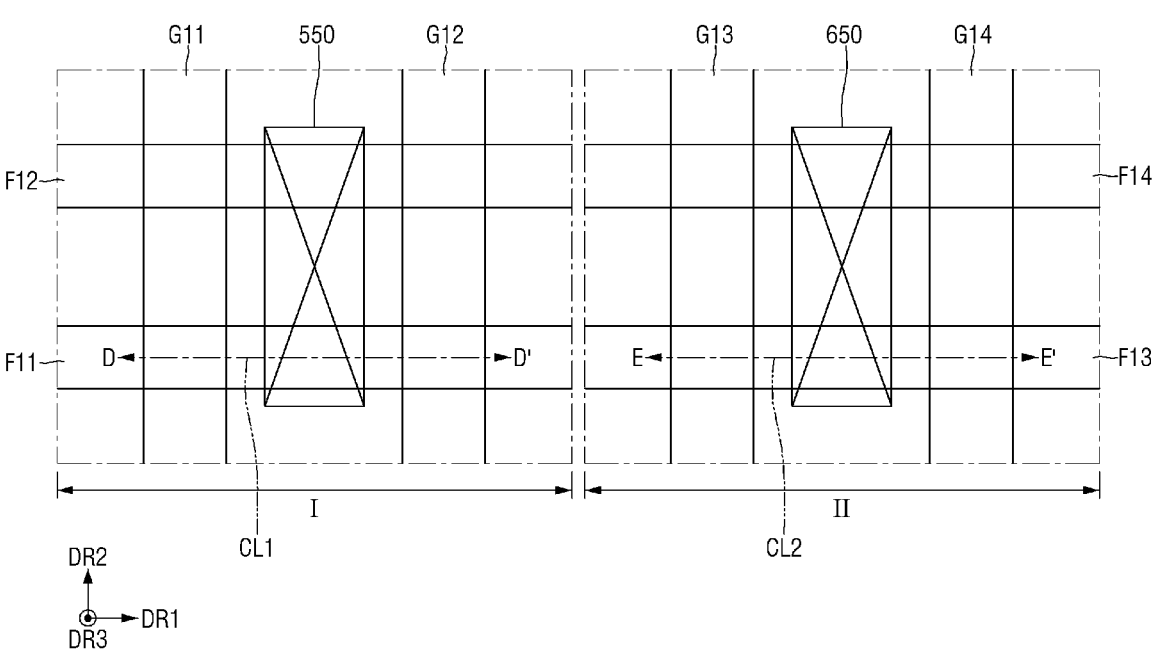
FIG. 31 is a schematic layout diagram of a semiconductor device according to some other embodiments of the present disclosure.

FIG. 31 is a schematic layout diagram for explaining a semiconductor device according to alternate embodiments of the present disclosure. FIG. 32 is a cross-sectional view taken along each of lines D-D' and E-E' of FIG. 31.

Figure 32:
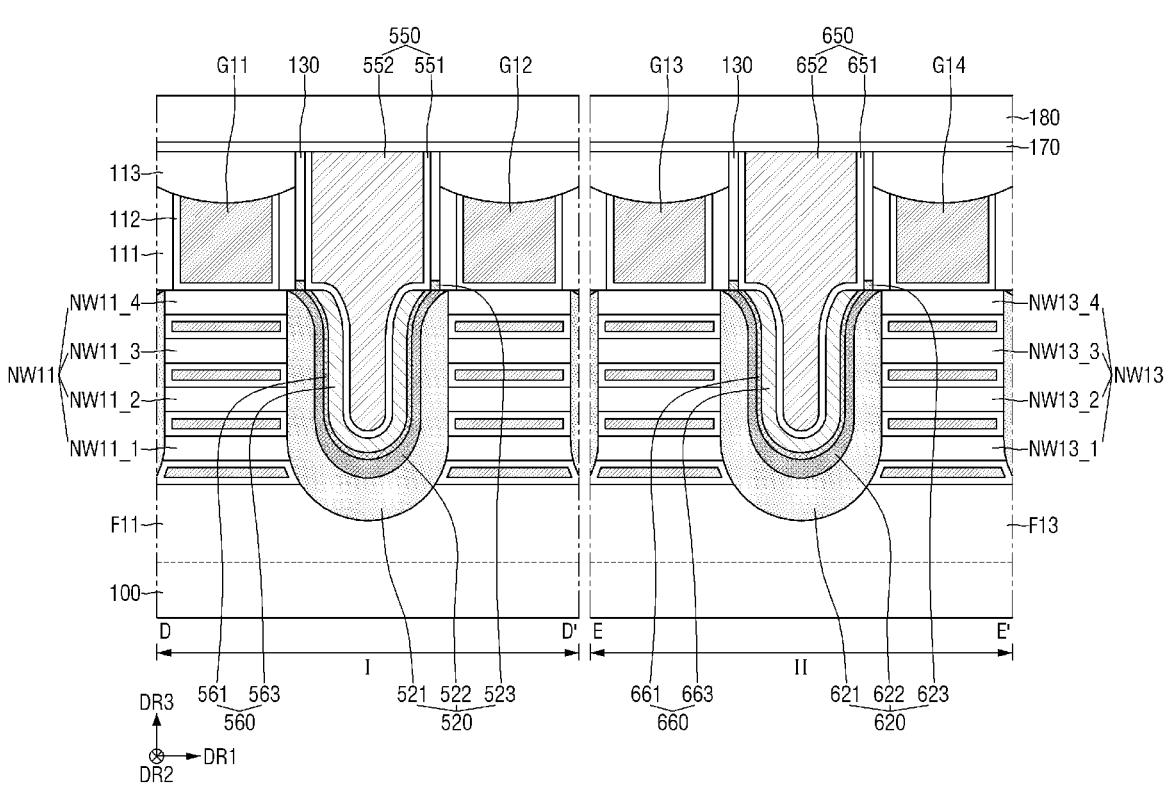
FIG. 32 is a cross-sectional view taken along each of lines D-D' and E-E' of FIG. 31.

Referring to FIGS. 31 and 32, in the semiconductor device according to some other embodiments of the present disclosure, the substrate 100 may include a first region I that is an NMOS region, and a second region II that is a PMOS region.

A first active pattern F11, a second active pattern F12, a first plurality of nanosheets NW11, a first gate electrode G11, a second gate electrode G12, a gate spacer 111, a gate insulating layer 112, a gate capping pattern 113, a first source/drain region 520, a liner layer 130, a first source/drain contact 550, a first silicide layer 560, an etching stop layer 170, and a second interlayer insulating layer 180 may be disposed on the substrate 100 of the first region I.

The first plurality of nanosheets NW11 may include first to fourth nanosheets NW11_1, NW11_2, NW11_3 and NW11_4 that are stacked on the first active pattern F11 to be spaced apart from each other in the vertical direction DR3 (e.g., a Z-axis direction). The first source/drain region 520 may include a first doping layer 521, a second doping layer 522, and a first capping layer 523. The first source/drain contact 550 may include a first contact barrier layer 551 and a first contact filling layer 552. The first silicide layer 560 may include a first layer 561, a second layer (not shown), and a third layer 563.

A third active pattern F13, a fourth active pattern F14, a second plurality of nanosheets NW13, a third gate electrode G13, a fourth gate electrode G14, a gate spacer 111, a gate insulating layer 112, a gate capping pattern 113, a second source/drain region 620, a liner layer 130, a second source/drain contact 650, a second silicide layer 660, an etching stop layer 170, and a second interlayer insulating layer 180 may be disposed on the substrate 100 of the second region II.

The second plurality of nanosheets NW13 includes fifth to eighth nanosheets NW_1, NW13_2, NW_3 and NW_4 that are stacked on the third active pattern F13 to be spaced apart from each other in the vertical direction DR3. The second source/drain region 620 may include a third doping layer 621, a fourth doping layer 622 and a second capping layer 623. The second source/drain contact 650 may include a second contact barrier layer 651 and a second contact filling layer 652. The second silicide layer 660 may include a fourth layer 661, a fifth layer (not shown), and a sixth layer 663.

The semiconductor device disposed in each of the first region I which is the NMOS region and the second region II which is the PMOS region may have the same structure as the semiconductor device shown in FIG. 2.

In the cross section that is cut in the first horizontal direction DR1 along the first center line CL1 that equally divides the first active pattern F11 of the first region I that is the NMOS region in the second horizontal direction DR2, the bottom surface of the second doping layer 522 may be formed between the first active pattern F11 and the first nanosheet NW11_1. Further, in the cross section that is cut in the first horizontal direction DR1 along a second center line CL2 that equally divides the third active pattern F13 of the second region II that is the PMOS region in the second horizontal direction DR2, the bottom surface of the fourth doping layer 622 may be formed between the third active pattern F13 and the fifth nanosheet NW13_1.

Hereinafter, the semiconductor device according to some other embodiments of the present disclosure will be described referring to FIG. 33. Differences from the semiconductor devices shown in FIGS. 30 to 32 will be mainly described.

Figure 33:
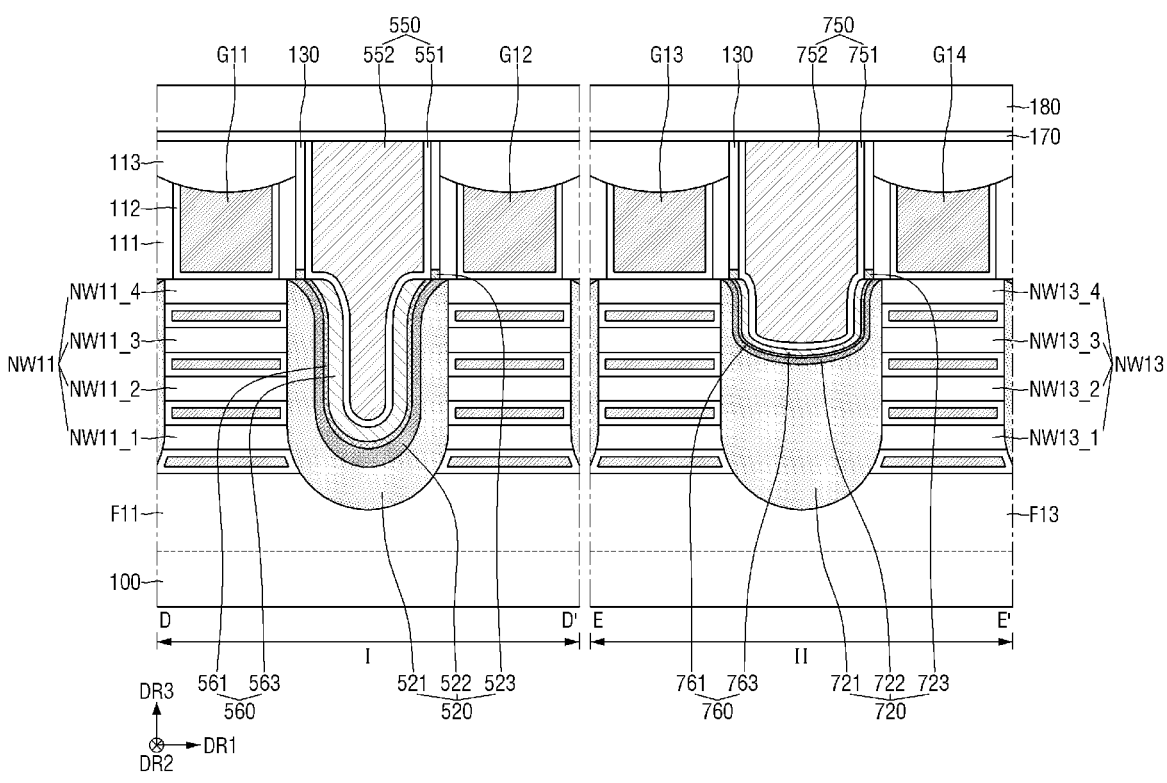
FIG. 33 is a cross-sectional view of a semiconductor device according to some other embodiments of the present disclosure.

FIG. 33 is a cross-sectional view of a semiconductor device according to alternate embodiments of the present disclosure.

Referring to FIG. 33, in the semiconductor device according to some other embodiments of the present disclosure, the semiconductor device disposed in the first region I which is the NMOS region may have the same structure as the semiconductor device disposed in the region I which is the NMOS region of FIG. 32.

A second source/drain region 720, a second source/drain contact 750, and a second silicide layer 760 may be disposed on the substrate 100 of the second region II which is the PMOS region. The second source/drain region 720 may include a third doping layer 721, a fourth doping layer 722, and a second capping layer 723. The second source/drain contact 750 may include a second contact barrier layer 751 and a second contact filling layer 752. The second silicide layer 760 may include a fourth layer 761, a fifth layer (not shown), and a sixth layer 763.

The semiconductor device disposed in the second region II, which is the PMOS region, may have the same structure as the semiconductor device shown in FIG. 30. In the cross section that is cut in the first horizontal direction DR1 along the second center line (CL2 of FIG. 31) that equally divides the third active pattern F13 of the second region II, which is the PMOS region, in the second horizontal direction DR2, the bottom surface of the fourth doping layer 722A may be formed between the sixth nanosheet NW13_2 and the seventh nanosheet NW13_3.

Hereinafter, a semiconductor device according to some other embodiments of the present disclosure will be described referring to FIG. 34. Differences from the semiconductor devices shown in FIGS. 30 to 32 will be mainly described.

Figure 34:
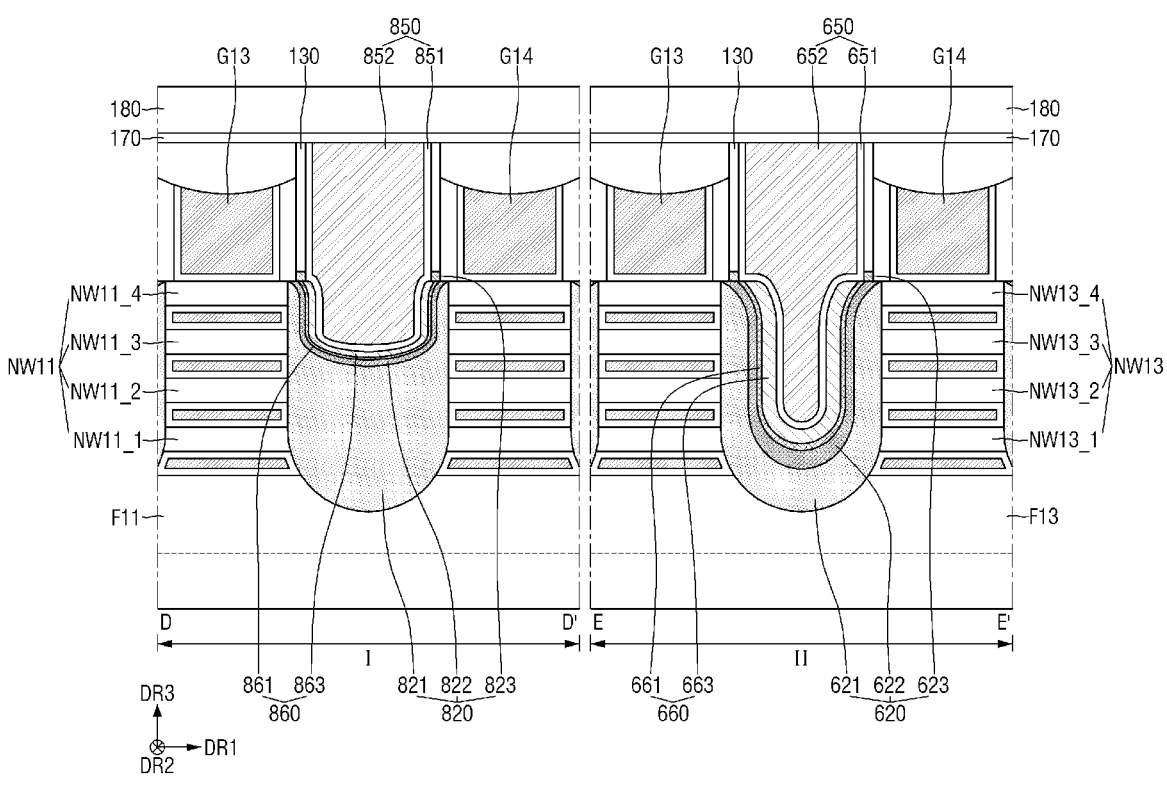
FIG. 34 is a cross-sectional view of a semiconductor device according to some other embodiments of the present disclosure.

FIG. 34 is a cross-sectional view of a semiconductor device according to alternate embodiments of the present disclosure.

Referring to FIG. 34, in the semiconductor device according to some other embodiments of the present disclosure, the semiconductor device disposed in the second region II which is the PMOS region may have the same structure as the semiconductor device disposed in the second region II which is the PMOS region of FIG. 32.

A first source/drain region 820, a first source/drain contact 850, and a first silicide layer 860 may be disposed on the substrate 100 of the first region I which is the NMOS region. The first source/drain region 820 may include a first doping layer 821, a second doping layer 822, and a first capping layer 823. The first source/drain contact 850 may include a first contact barrier layer 851 and a first contact filling layer 852. The first silicide layer 860 may include a first layer 861, a second layer (not shown), and a third layer 863.

The semiconductor device disposed in the first region I, which is the NMOS region, may have the same structure as the semiconductor device shown in FIG. 30. In the cross section that is cut in the first horizontal direction DR1 along the first center line (CL1 of FIG. 31) that equally divides the first active pattern F11 of the first region I, which is the NMOS region, in the second horizontal direction DR2, the bottom surface of the second doping layer 822 may be formed between the second nanosheet NW11_2 and the third nanosheet NW11_3.

Hereinafter, a semiconductor device according to alternate embodiments of the present disclosure will be described referring to FIG. 35. Differences from the semiconductor device shown in FIGS. 33 and 34 will be mainly described.

Figure 35:
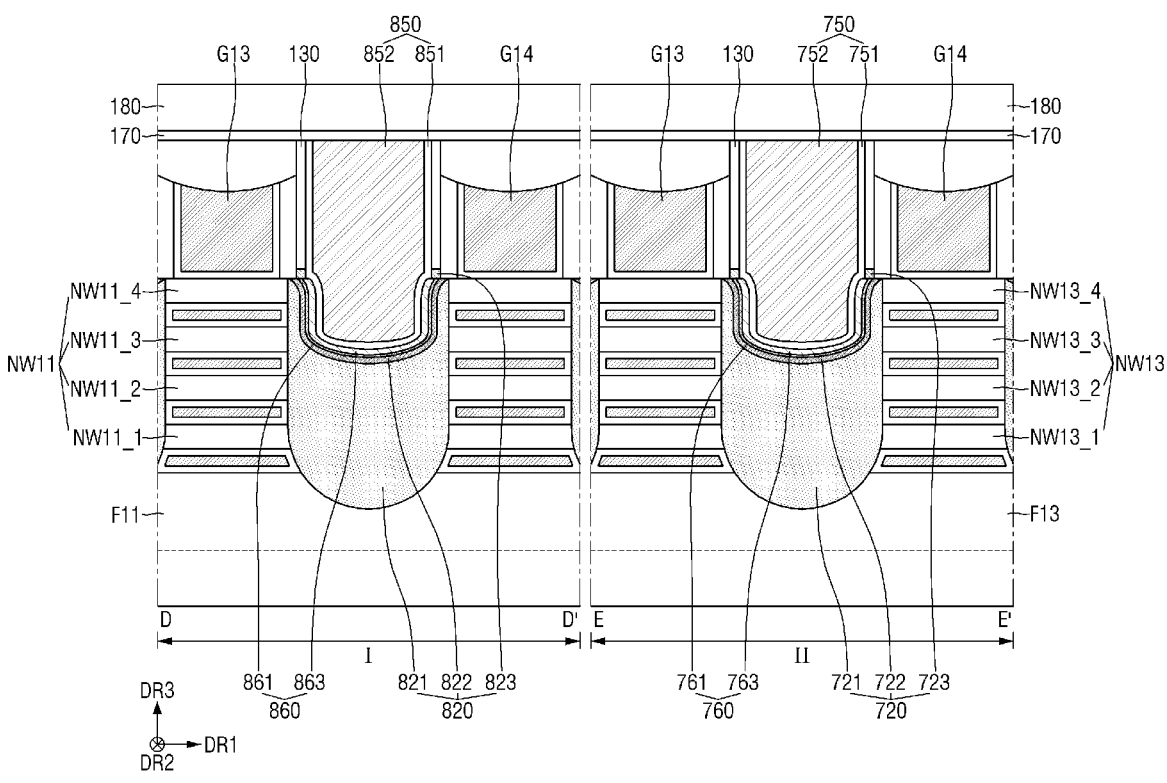
FIG. 35 is a cross-sectional view of a semiconductor device according to some other embodiments of the present disclosure.

FIG. 35 is a cross-sectional view of a semiconductor device according to alternate embodiments of the present disclosure.

Referring to FIG. 35, in the semiconductor device according to some other embodiments of the present disclosure, the semiconductor device disposed in the first region I which is the NMOS region may have the same structure as the semiconductor device disposed in the first region I which is the NMOS region of FIG. 34. Further, the semiconductor device disposed in the second region II which is the PMOS region may have the same structure as the semiconductor device disposed in the second region II which is the PMOS region of FIG. 33.

In concluding the detailed description, those skilled in the art will appreciate that many variations and modifications may be made to the example embodiments without substantially departing from the scope of the present invention. Therefore, the disclosed example embodiments of the disclosure are used in a generic and descriptive sense only and not for purposes of limitation.

What is claimed is:

1. A semiconductor device comprising:
a substrate;
an active pattern which extends in a first horizontal direction on the substrate;
a plurality of nanosheets spaced apart from each other in a vertical direction and extending in the first horizontal direction on the active pattern;
a gate electrode which extends in a second horizontal direction different from the first horizontal direction on the substrate and surrounds each of the plurality of nanosheets;
a field insulating layer on the substrate which surrounds side walls of the active pattern;
an interlayer insulating layer on the field insulating layer;
a source/drain region on at least one side of the gate electrode on the active pattern which comprises a first doping layer on the active pattern, a second doping layer on the first doping layer, and a capping layer that comprises side walls adjacent to the interlayer insulating layer;
a source/drain contact which is electrically connected to the source/drain region and is on the source/drain region; and
a silicide layer between the source/drain region and the source/drain contact wherein the silicide layer is in contact with the second doping layer and extends to an upper surface of the source/drain region on the second doping layer,
wherein the capping layer extends from an upper surface of the field insulating layer to the upper surface of the source/drain region along side walls of the silicide layer, wherein the first doping layer overlaps the second doping layer in the first horizontal direction and the second horizontal direction, and
wherein the first doping layer overlaps the source/drain contact in the first horizontal direction.

2. The semiconductor device of claim 1, wherein:
the first doping layer comprises silicon which is doped with a first impurity at a first concentration;
the second doping layer comprises silicon doped with the first impurity at a second concentration higher than the first concentration or silicon carbide doped with a second impurity; and
the capping layer comprises silicon which is not doped with an impurity.

3. The semiconductor device of claim 2, wherein the first impurity is phosphorus (P), and the second impurity comprises any one or more of phosphorus (P), arsenic (As), and antimony (Sb).

4. The semiconductor device of claim 1, wherein an uppermost surface of the silicide layer is coplanar with an uppermost surface of the capping layer.

5. The semiconductor device of claim 1, wherein:
the silicide layer is between the second doping layer and a contact barrier layer of the source/drain contact and is further between the capping layer and the contact barrier layer, and wherein the silicide layer further comprises:
a first layer along a surface of the second doping layer;
a second layer along side walls of the capping layer; and
a third layer between the first layer and the contact barrier layer of the source/drain contact, and between the second layer and the contact barrier layer of the source/drain contact.

6. The semiconductor device of claim 5, wherein at least one of the first to third layers comprises at least one different material from one or more of the other layers.

7. The semiconductor device of claim 1, wherein the silicide layer is in contact with the capping layer.

8. The semiconductor device of claim 1, wherein:
the second doping layer is between the silicide layer and the capping layer, and
the second doping layer extends along side walls of the capping layer to the upper surface of the source/drain region.

9. The semiconductor device of claim 8, wherein the silicide layer comprises:
a first layer along at least a portion of a surface of the second doping layer; and
a second layer between the first layer and the source/drain contact.

10. The semiconductor device of claim 1, wherein the silicide layer comprises a single film between the second doping layer and the source/drain contact.

11. The semiconductor device of claim 1, wherein the plurality of nanosheets comprises first, second, and third nanosheets, and wherein in a cross section which is cut in the first horizontal direction along a center line that equally divides the active pattern in the second horizontal direction, a bottom surface of the second doping layer is between the active pattern and the first nanosheet.

12. The semiconductor device of claim 1, wherein the plurality of nanosheets comprises first, second, and third nanosheets, and wherein in a cross section which is cut in the first horizontal direction along a center line that equally divides the active pattern in the second horizontal direction, a bottom surface of the second doping layer is between the second nanosheet and the third nanosheet of the plurality of nanosheets.

13. A semiconductor device comprising:

a substrate;

an active pattern which extends in a first horizontal direction on the substrate;

a plurality of nanosheets spaced apart from each other in a vertical direction and extending in the first horizontal direction on the active pattern;

a gate electrode which extends in a second horizontal direction different from the first horizontal direction on the substrate and surrounds each of the plurality of nanosheets;

a field insulating layer on the substrate which surrounds side walls of the active pattern;

an interlayer insulating layer on the field insulating layer;

a source/drain region on at least one side of the gate electrode on the active pattern which comprises a capping layer that comprises side walls adjacent to the interlayer insulating layer;

a source/drain contact which is electrically connected to the source/drain region and is on the source/drain region; and a silicide layer between the source/drain region and the source/drain contact wherein the silicide layer comprises a first layer along an inner surface of the source/drain region and a second layer disposed between the first layer and the source/drain contact which extends along side walls of the capping layer to an upper surface of the source/drain region, wherein:

the first layer and the second layer comprise different materials from each other, the capping layer comprises silicon that is not doped with an impurity, and an uppermost surface of the silicide layer is coplanar with an uppermost surface of the capping layer.

14. The semiconductor device of claim 13, wherein the source/drain region further comprises:

a first doping layer on the active pattern which comprises silicon doped with a first impurity at a first concentration; and a second doping layer on the first doping layer which comprises silicon doped with the first impurity at a second concentration higher than the first concentration or silicon carbide doped with a second impurity.

15. The semiconductor device of claim 14, wherein:

the second doping layer is between the silicide layer and the capping layer, and the second doping layer extends along the side walls of the capping layer to the upper surface of the source/drain region.

16. The semiconductor device of claim 13, wherein the capping layer extends from an upper surface of the field insulating layer to the upper surface of the source/drain region along side walls of the silicide layer.

17. The semiconductor device of claim 13, wherein the silicide layer further comprises a third layer between the second layer and the capping layer which is in contact with the capping layer and extends along the side walls of the capping layer to the upper surface of the source/drain region.

18. A semiconductor device comprising:

a substrate having a first region and a second region;

a first active pattern which extends in a first horizontal direction on the first region of the substrate;

a first plurality of nanosheets spaced apart from each other in a vertical direction and extending in the first horizontal direction on the first active pattern;

a first gate electrode which extends in a second horizontal direction different from the first horizontal direction on the first region of the substrate and surrounds each of the plurality of nanosheets;

a field insulating layer on the substrate which surrounds side walls of the first active pattern;

an interlayer insulating layer on the field insulating layer;

a first source/drain region on at least one side of the first gate electrode on the first active pattern which comprises a first doping layer on the first active pattern, a second doping layer on the first doping layer, and a first capping layer that comprises side walls adjacent to the interlayer insulating layer;

a first source/drain contact which is electrically connected to the first source/drain region and is on the first source/drain region; and a first silicide layer between the first source/drain region and the first source/drain contact wherein the first silicide layer comprises a first layer along a surface of the second doping layer, a second layer extending to an upper surface of the first source/drain region along side walls of the first capping layer, and a third layer between the first layer and the first source/drain contact and between the second layer and the first source/drain contact, wherein one or more of the first layer, the second layer and the third layer comprise at least one different material from one or more of the other layers, the first capping layer comprises silicon that is not doped with an impurity, and the first capping layer extends from an upper surface of the field insulating layer to the upper surface of the first source/drain region along side walls of the first silicide layer.

19. The semiconductor device of claim 18, wherein the first plurality of nanosheets comprises first, second, and third nanosheets, the semiconductor device further comprising:

a second active pattern extending in the first horizontal direction on the second region of the substrate;

a second plurality of nanosheets comprising fourth to sixth nanosheets spaced apart from each other in the vertical direction and extending in the first horizontal direction on the second active pattern;

a second gate electrode which extends in the second horizontal direction on the second region of the substrate and surrounds each of the fourth to sixth nanosheets;

a second source/drain region on at least one side of the second gate electrode on the second active pattern wherein the second source/drain region comprises a third doping layer on the second active pattern, a fourth doping layer on the third doping layer, and a second capping layer that comprises side walls adjacent to the interlayer insulating layer;

a second source/drain contact which is electrically connected to the second source/drain region and is on the second source/drain region; and a second silicide layer between the second source/drain region and the second source/drain contact which comprises a fourth layer along a surface of the fourth doping layer, a fifth layer extending to an upper surface of the second source/drain region along side walls of the second capping layer, and a sixth layer between the fourth layer and the second source/drain contact and between the fifth layer and the second source/drain contact, wherein one or more of the fourth layer, the fifth layer and the sixth layer comprise at least one different material from one or more of the fourth layer, fifth layer, and sixth layer, the second capping layer comprises silicon that is not doped with an impurity, the second capping layer extends from the upper surface of the field insulating layer to the upper surface of the second source/drain region along side walls of the second silicide layer, wherein in a cross section that is cut in the first horizontal direction along a first center line that equally divides the first active pattern in the second horizontal direction, a bottom surface of the second doping layer is between the first active pattern and the first nanosheet, and in a cross section that is cut in the first horizontal direction along a second center line that equally divides the second active pattern in the second horizontal direction, a bottom surface of the fourth doping layer is between the fifth nanosheet and the sixth nanosheet.

20. The semiconductor device of claim 18, wherein the first doping layer comprises silicon which is doped with a first impurity at a first concentration, the second doping layer comprises silicon doped with the first impurity at a second concentration higher than the first concentration or silicon carbide doped with a second impurity, and the first capping layer comprises silicon that is not doped with an impurity.

* * * * *